US012052877B2

(12) United States Patent
Forrest et al.

(10) Patent No.: US 12,052,877 B2
(45) Date of Patent: Jul. 30, 2024

(54) ORGANIC TERNARY SOLAR CELLS AND VACUUM-DEPOSITED METHOD

(71) Applicant: The Regents of the University of Michigan, Ann Arbor, MI (US)

(72) Inventors: Stephen R. Forrest, Ann Arbor, MI (US); Yongxi Li, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 139 days.

(21) Appl. No.: 17/038,718

(22) Filed: Sep. 30, 2020

(65) Prior Publication Data
US 2021/0098725 A1  Apr. 1, 2021

Related U.S. Application Data

(60) Provisional application No. 62/909,173, filed on Oct. 1, 2019.

(51) Int. Cl.
H10K 30/30 (2023.01)
H10K 71/16 (2023.01)
H10K 85/20 (2023.01)

(52) U.S. Cl.
CPC ........... H10K 30/30 (2023.02); H10K 71/164 (2023.02); H10K 85/211 (2023.02)

(58) Field of Classification Search
CPC ............... H01L 51/4253; H01L 51/001; H01L 51/0046; H01L 51/4246; H10K 30/30; H10K 85/211; H10K 71/164
See application file for complete search history.

(56) References Cited

U.S. PATENT DOCUMENTS

| 2014/0001455 A1* | 1/2014 | Holmes ................. B82Y 10/00 257/40 |
| 2016/0343966 A1 | 11/2016 | Forrest |
| 2017/0005284 A1* | 1/2017 | Che ....................... H01L 51/422 |
| 2021/0050540 A1* | 2/2021 | Barr ...................... H01L 51/442 |

OTHER PUBLICATIONS

Che, Donor-Acceptor-Acceptor's Molecules for Vacuum-Deposited Organic Photovoltaics with Efficiency Exceeding 9%, Adv. Energy Mater. 2018, 8, 1703603, pp. 1-6 and Supplementary material, S-1-S-8 (Year: 2018).*
Cheng, Next-generation organic photovoltaics based on non-fullerene acceptors, Nature Photonics vol. Mar. 12, 2018 pp. 131-142 (Year: 2018).*
Nakayama, Single-Component Organic Solar Cells Based on Intra-molecular Charge Transfer Photoabsorption, Materials 2021, 14, 1200, pp. 1-11 (Year: 2021).*

(Continued)

*Primary Examiner* — Devina Pillay
(74) *Attorney, Agent, or Firm* — Riverside Law LLP

(57) ABSTRACT

A method of making a photovoltaic cell comprises the steps of providing a substrate in a vacuum, depositing an anode over the substrate, depositing a first heterojunction layer over the anode layer, depositing a second heterojunction layer over the first heterojunction layer, depositing a cathode over the second heterojunction layer, and releasing the vacuum. A photovoltaic cell is also described.

11 Claims, 27 Drawing Sheets

(56) References Cited

OTHER PUBLICATIONS

Zhu, Optical simulation and experimental determination of the effect of subcell sequence in tetraphenyldibenzoperiflanthene- and phthalocyanine-based, Phys. Status Solidi A 214, No. 10, 1700340 (2017), pp. 1-6 (Year: 2017).*
Ameri, T., Khoram, P., Min, J. and Brabec, C.J., "Organic ternary solar cells: A review," Advanced Materials, vol. 25, No. 31, pp. 4245-4266, 2013.
An, Q.; Zhang, F.; Zhang, J.; Tang, W.; Deng, Z.; Hu, B. Versatile ternary organic solar cells: a critical review. Energy Environ. Sci. 2016, 9, 281.
Athanasopoulos, S.; Schauer, F.; Na'daz?dy, V.; Weiß, M.; Kahle, F. J.; Scherf, U.; Bässler, H.; Köhler, A. What is the Binding Energy of a Charge Transfer State in an Organic Solar Cell? Adv. Energy Mater. 2019, 9, 1900814.
Bailey-Salzman, R. F.; Rand, B. P.; Forrest, S. R. Semitransparent organic photovoltaic cells. Appl. Phys. Lett. 2006, 38, 233502.
Burlingame et al., "Centimetre-scale electron diffusion in photoactive organic heterostructures", Nature vol. 554, pp. 77-80 (2018) Jan. 18, 2018; [online] <https://www.nature.com/articles/nature25148 > 8 pages.
Burlingame, Q., Huang, X., Liu, X. et al. Intrinsically stable organic solar cells under high-intensity illumination. Nature 573, 394-397 (2019).
Che, X. et al., "Donor-acceptor-acceptor' molecules for vacuum-deposited organic photovoltaics with efficiency exceeding 9%," Advanced Energy Materials, 2018.
Che, X. Z.; Li, Y. X.; Qu, Y.; Forrest, S. R. High fabrication yield organic tandem photovoltaics combining vacuum- and solutionprocessed subcells with 15% efficiency. Nature Energy 2018, 3, 422.
Che, X., Xiao, X., Zimmerman, J.D., Fan, D. and Forrest, S.R., "High-efficiency, vacuum-deposited, small-molecule organic tandem and triple-junction photovoltaic cells," Advanced Energy Materials, vol. 4, No. 18, p. 1400568, 2014.
Chen, S.; Manders, J. R.; Tsang, S.-W.; So, F. Metal oxides for interface engineering in polymer solar cells. J. Mater. Chem. 2012, 22, 24202.
Chen, Y.H. et al., "Vacuum-deposited small-molecule organic solar cells with high power conversion efficiencies by judicious molecular design and device optimization," Journal of the American Chemical Society, vol. 134, No. 33, pp. 13616-13623, 2012.
Dou, J. H.; Yu, Z. A.; Zhang, J.; Zheng, Y. Q.; Yao, Z. F.; Tu, Z.; Wang, X.; Huang, S.; Liu, C.; Sun, J.; Yi, Y.; Cao, X.; Gao, Y.; Wang, J. Y.; Pei, J. Organic Semiconducting Alloys with Tunable Energy Levels. J. Am. Chem. Soc. 2019, 141, 6561.
Fan, B.; Zhang, D.; Li, M.; Zhong, W.; Zeng, Z.; Ying, L.; Huang, F.; Cao, Y. Achieving over 16% efficiency for single-junction organic solar cells. Sci. China: Chem. 2019, 62, 746.
Forrest, S. The path to ubiquitous and low-cost organic electronic appliances on plastic. Nature 428, 911-918 (2004). https://doi.org/10.1038/nature02498.
Fu, H.; Wang, Z.; Sun, Y. Advances in Non-Fullerene Acceptor Based Ternary Organic Solar Cells. Solar RRL 2018, 2, 1700158.
Gao, F.; Tress, W.; Wang, J.; Inganäs, O. Temperature Dependence of Charge Carrier Generation in Organic Photovoltaics. Phys. Rev. Lett. 2015, 114, 128701.
Gao, W.; Liu, T.; Zhong, C.; Zhang, G.; Zhang, Y.; Ming, R.; Zhang, L.; Xin, J.; Wu, K.; Guo, Y.; Ma, W.; Yan, H.; Liu, Y.; Yang, C. Asymmetrical Small Molecule Acceptor Enabling Nonfullerene Polymer Solar Cell with Fill Factor Approaching 79%. ACS Energy Lett. 2018, 3, 1760.
Ghasemi, M.; Ye, L.; Zhang, Q.; Yan, L.; Kim, J.-H.; Awartani, O.; You, W.; Gadisa, A.; Ade, H. Panchromatic Sequentially Cast Ternary Polymer Solar Cells. Adv. Mater. 2017, 29, 1604603.
Griffith, O. L. et al. Charge transport and exciton dissociation in organic solar cells consisting of dipolar donors mixed with C70. Phys. Rev. B 92, 085404 (2015) 9 pages.
Guo, X.; Zhou, N.; Lou, S. J.; Smith, J.; Tice, D. B.; Hennek, J. W.; Ortiz, R. P .; Navarrete, J. T. L.; Li, S.; Strzalka, J.; Chen, L. X.; Chang, R. P. H.; Facchetti, A.; Marks, T. J. Polymer solar cells with enhanced fill factors. Nat. Photonics 2013, 7, 825.
Huang, J. et al., "Highly efficient organic solar cells consisting of double bulk heterojunction layers," Advanced Materials, vol. 29, No. 19, p. 1606729, 2017.
Ishii, H.; Sugiyama, K.; Ito, E.; Seki, K. Energy Level Alignment and Interfacial Electronic Structures at Organic/Metal and Organic/Organic Interfaces. Adv. Mater. 1999, 11, 605.
Izawa, S.; Shintaku, N.; Hiramoto, M. Effect of Band Bending and Energy Level Alignment at the Donor/Acceptor Interface on Open-Circuit Voltage in Organic Solar Cells. J. Phys. Chem. Lett. 2018, 9, 2914.
Li, C.; Fu, H.; Xia, T.; Sun, Y. Asymmetric Nonfullerene Small Molecule Acceptors for Organic Solar Cells. Adv. Energy Mater. 2019, 9, 1900999.
Li, et al., "High Efficiency Near-Infrared and Semitransparent Non-Fullerene Acceptor Organic Photovoltaic Cells", J. Am. Chem. Soc., 2017, 139, 17114-17119.
Li, et al., Vacuum-Deposited Biternary Organic Photovoltaics. J. Am. Chem. Soc. 2019, 141, 18204-18210.
Li, T.y. et al., "Small molecule near-infrared boron dipyrromethene donors for organic tandem solar cells," Journal of the American Chemical Society, vol. 139, No. 39, pp. 13636-13639, 2017.
Li, Y.; Lin, J. D.; Liu, X.; Qu, Y.; Wu, F.- P.; Liu, F.; Jiang, Z. Q.; Forrest, S. R. Near-Infrared Ternary Tandem Solar Cells. Advanced Materials, 2018, 1804416, 7 pages.
Liu, X., Ding, K., Panda, A. & Forrest, S. R. Charge transfer states in dilute donor-acceptor blend organic heterojunctions. ACS Nano 10, 7619-7626 (2016).
Liu, X.; Li, Y.; Ding, K.; Forrest, S. Energy Loss in Organic Photovoltaics: Nonfullerene Versus Fullerene Acceptors. Phys. Rev. Appl. 2019, 11, No. 024060.
Lu, L. Y.; Kelly, M. A.; You, W.; Yu, L. P. Status and prospects for ternary organic photovoltaics. Nat. Photonics 2015, 9, 491.
Meng et al., "Organic and solution-processed tandem solar cells with 17.3% efficiency", Science vol. 361, Issue 6407. pp. 1094-1098; Sep. 14, 2018; [online] <https://science.sciencemag.org/content/361/6407/1094.full > 5 pages.
Panda, A.; Renshaw, C. K.; Oskooi, A.; Lee, K.; Forrest, S. R. Excited state and charge dynamics of hybrid organic/inorganic heterojunctions. II. Experiment. Phys. Rev. B: Condens. Matter Mater. Phys. 2014, 90, No. 045303.
Pandey, R.; Gunawan, A. A.; Mkhoyan, K. A.; Holmes, R. J. Efficient Organic Photovoltaic Cells Based on Nanocrystalline Mixtures of Boron Subphthalocyanine Chloride and C60. Adv. Funct. Mater. 2012, 22, 617-624.
Schwarze, M.; Tress, W.; Beyer, B.; Gao, F.; Scholz, R.; Poelking, C.; Ortstein, K.; Gunther, A. A.; Kasemann, D.; Andrienko, D.; Leo, K. Band structure engineering in organic semiconductors. Science 2016, 352, 1446.
Shim, H.-S.; Moon, C.-K.; Kim, J.; Wang, C.-K.; Sim, B.; Lin, F.; Wong, K.-T.; Seo, Y.; Kim, J.-J. Efficient Vacuum-Deposited Ternary Organic Solar Cells with Broad Absorption, Energy Transfer, and Enhanced Hole Mobility. ACS Appl. Mater. Interfaces 2016, 8, 1214.
Ku, X.; Feng, K.; Bi, Z.; Ma, W.; Zhang, G.; Peng, Q. Single-Junction Polymer Solar Cells with 16.35% Efficiency Enabled by a Platinum(II) Complexation Strategy. Adv. Mater. 2019, 31, No. e1901872.
Y. Cui, H. Yao, J. Zhang, T. Zhang, Y. Wang, L. Hong, K. Xian, B. Xu, S. Zhang, J. Peng, Z. Wei, F. Gao and J. Hou, Over 16% efficiency organic photovoltaic cells enabled by a chlorinated acceptor with increased open-circuit voltages, Nat. Commun. 10, 2515 (2019).
Yang, L.; Yan, L.; You, W. Organic Solar Cells beyond One Pair of Donor-Acceptor: Ternary Blends and More. J. Phys. Chem. Lett. 2013, 4, 1802.
Yuan, J.; Zhang, Y.; Zhou, L.; Zhang, G.; Yip, H.-L.; Lau, T.-K.; Lu, X.; Zhu, C.; Peng, H.; Johnson, P. A.; Leclerc, M.; Cao, Y.; Ulanski,

(56) References Cited

OTHER PUBLICATIONS

J.; Li, Y.; Zou, Y. Single-Junction Organic Solar Cell with over 15% Efficiency Using Fused-Ring Acceptor with Electron-Deficient Core. Joule 2019, 3, 1140.

Zimmerman, J. D.; Xiao, X.; Renshaw, C. K.; Wang, S.; Diev, V. V.; Thompson, M. E.; Forrest, S. R. Independent control of bulk and interfacial morphologies of small molecular weight organic heterojunction solar cells. Nano Lett. 2012, 12, 4366.

Zou, Y.; Holmes, R. J. Influence of a MoOx interlayer on the open-circuit voltage in organic photovoltaic cells. Appl. Phys. Lett. 2013, 103, No. 053302.

* cited by examiner

ORGANIC TERNARY SOLAR CELLS AND VACUUM-DEPOSITED METHOD

CROSS-REFERENCE TO RELATED APPLICATIONS

This application claims priority to U.S. Provisional Patent Application No. 62/909,173 filed on Oct. 1, 2019, incorporated herein by reference in its entirety.

STATEMENT REGARDING FEDERALLY SPONSORED RESEARCH OR DEVELOPMENT

This invention was made with government support under DE-EE0006708 awarded by the U.S. Department of Energy. The government has certain rights in the invention.

BACKGROUND OF THE INVENTION

Organic photovoltaic cells (OPVs) have sparked considerable interest in recent years. Their flexibility, light weight and semi-transparence suggest potential uses in building integrated and building applied applications. Considerable efforts have been devoted to material design, device engineering, and morphology optimization, contributing to the achievement of power conversion efficiencies (PCE) exceeding 15% for both single and tandem OPVs. Additionally, stable vacuum thermal evaporation (VTE)-grown, fullerene-based, small molecule OPVs have been demonstrated with intrinsic lifetimes exceeding 107 h when aged at very high light intensities. With such significant improvements in efficiency and lifetime, OPVs present a realistic option for renewable energy generation. Although VTE-grown small molecule OPVs have proven to be efficient and intrinsically stable, and despite the potential for scalability using manufacturing methods now routinely employed for organic light-emitting diode displays and lighting, the performance of VTE-grown OPVs remains limited by high thermalization energy losses. As a consequence, the maximum PCE of fully thermally evaporated OPVs has reached only 9.6% for single junction, and 10.0% for tandem solar cells.

Ternary blend organic solar cells integrating multiple donor or acceptor materials in one photoactive layer have emerged as a promising strategy to simultaneously improve device parameters compared with traditional binary solar cells, such as strong light absorption ability, reduced energy loss, and the tunability of morphology properties. However, the difficulties in simultaneously optimizing the morphology of three molecular components results in devices that have generally exhibited performance inferior to analogous binary OPVs. Additionally, the choice of the third component is restricted to compounds that ensure efficient charge transfer between the molecules within the active layer. Furthermore, when the active region comprises two donors and one acceptor, the $V_{OC}$ of the ternary OPV is limited by the shallower one of the two highest occupied molecular orbitals (HOMO) of the donors, since holes are likely to transfer to higher energy levels prior to extraction at the anode (see FIG. 1A). This limits $V_{OC}$ and, therefore, the PCE attainable employing ternary component OPVs.

Recently, a large number of high-performance ternary solar cells by solution process have been developed. However, ternary organic photovoltaics (OPVs) in the vacuum process with small molecules have not shown much progress, although they have several advantages such as ease of material purification via sublimation and no solvent use. Vacuum-deposited ternary OPVs have only recently been reported using two donors and a fullerene acceptor. But such devices lag far behind solution-processed ternary OPVs, with a power conversion efficiency (PCE) of 8.0%.

SUMMARY OF THE INVENTION

In one aspect, a method of making a photovoltaic cell comprises providing a substrate in a vacuum, depositing an anode over the substrate, depositing a first heterojunction layer over the anode layer, depositing a second heterojunction layer over the first heterojunction layer, depositing a cathode over the second heterojunction layer, and releasing the vacuum. In one embodiment, the method further comprises depositing an electron transport layer between the anode and the first heterojunction layer. In one embodiment, the method further comprises depositing a hole transport layer between the second heterojunction layer and the cathode.

In one embodiment, the first heterojunction layer comprises a fullerene acceptor. In one embodiment, the first and second heterojunction layers comprise a same acceptor. In one embodiment, the anode comprises indium tin oxide. In one embodiment, the first heterojunction layer comprises at least two materials, and wherein the method further comprises monitoring a deposition rate of each of the at least two materials and adjusting the deposition rate of the at least two materials to achieve a desired volume ratio. In one embodiment, the volume ratio is between 1:3 and 3:1. In one embodiment, the volume ratio is between 1:2 and 2:1.

In another aspect, a photovoltaic cell comprises an anode, a cathode, a first binary bulk heterojunction positioned between the anode and the cathode, comprising a first donor material and a first acceptor material, and a second binary bulk heterojunction positioned between the first binary bulk heterojunction and the cathode, comprising a second donor material and a second acceptor material, wherein the first donor material has a band gap that is different from the second donor material.

In one embodiment, the first acceptor material and the second acceptor material are the same. In one embodiment, the first and second acceptor material comprises a fullerene acceptor material. In one embodiment, the first and second acceptor material comprises $C_{70}$ fullerene. In one embodiment, the first and second acceptor material comprises a non-fullerene acceptor material. In one embodiment, the device further comprises a third binary bulk heterojunction positioned between the second binary bulk heterojunction and the cathode, comprising a third donor material and a third acceptor material.

In one embodiment, the first donor material comprises DTDCPB. In one embodiment, the second donor material comprises iBuBTDC. In one embodiment, the first donor material comprises iBuBTDC. In one embodiment, the second donor material comprises DTDCPB. In one embodiment, the first donor material and the second donor material absorb at one or more overlapping wavelengths. In one embodiment, the photovoltaic cell has a power conversion efficiency of at least 15%.

In another aspect, a photovoltaic cell produced by the method described above comprises an anode, a cathode, a first binary bulk heterojunction positioned between the anode and the cathode, comprising a first donor material and a first acceptor material, and a second binary bulk heterojunction positioned between the first binary bulk heterojunction and the cathode, comprising a second donor material and a second acceptor material, wherein the first donor material has a band gap that is different from the second donor material. In one embodiment, the photovoltaic cell has a power conversion efficiency of at least 15%.

BRIEF DESCRIPTION OF THE DRAWINGS

The foregoing purposes and features, as well as other purposes and features, will become apparent with reference to the description and accompanying figures below, which are included to provide an understanding of the disclosure and constitute a part of the specification, in which like numerals represent like elements, and in which.

DETAILED DESCRIPTION

Figure 1A:
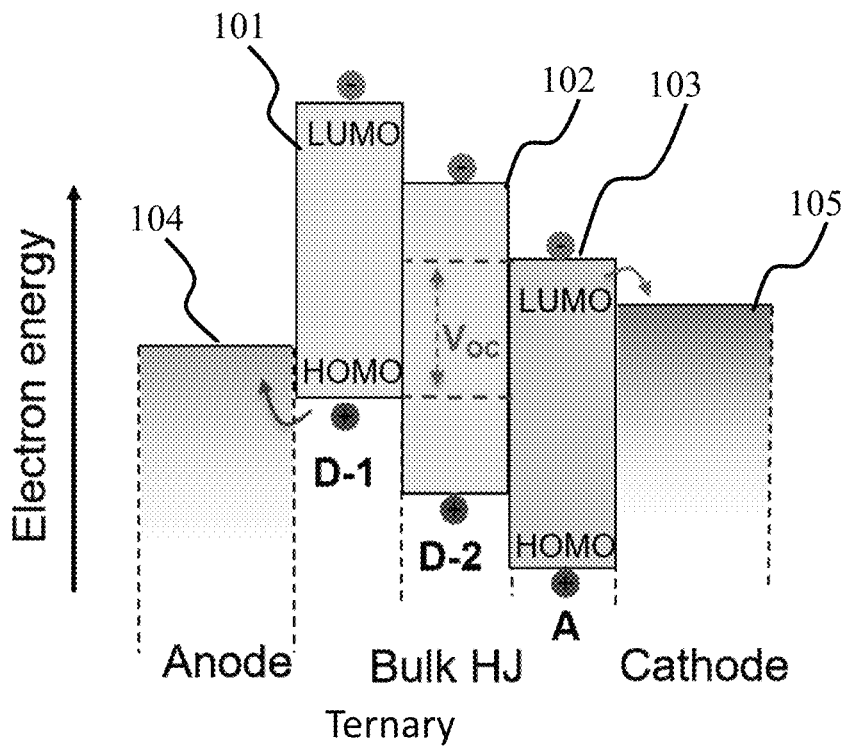
FIG. 1A is an energy level diagram of a ternary organic photovoltaic (OPV) cell.

It is to be understood that the figures and descriptions of the present disclosure have been simplified to illustrate elements that are relevant for a clear understanding of the present disclosure, while eliminating, for the purpose of clarity, many other elements found in related systems and methods. Those of ordinary skill in the art may recognize that other elements and/or steps are desirable and/or required in implementing the present disclosure. However, because such elements and steps are well known in the art, and because they do not facilitate a better understanding of the present disclosure, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this disclosure belongs. Although any methods and materials similar or equivalent to those described herein can be used in the practice or testing of the present disclosure, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of 20%, ±10%, +5%, ±1%, and ±0.1% from the specified value, as such variations are appropriate.

Throughout this disclosure, various aspects of the disclosure can be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

As used herein, the terms "electrode" and "contact" may refer to a layer that provides a medium for delivering photo-generated current to an external circuit or providing a bias current or voltage to the device. That is, an electrode, or contact, provides the interface between the active regions of an organic photosensitive optoelectronic device and a wire, lead, trace or other means for transporting the charge carriers to or from the external circuit. Examples of electrodes include anodes and cathodes, which may be used in a photosensitive optoelectronic device.

As used herein, the term "transparent" may refer to an electrode that permits at least 50% of the incident electromagnetic radiation in relevant wavelengths to be transmitted through it. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be transparent or at least semi-transparent.

As used herein, the term "semi-transparent" may refer to an electrode that permits some, but less than 50% transmission of ambient electromagnetic radiation in relevant wavelengths. The opposing electrode may be a reflective material so that light which has passed through the cell without being absorbed is reflected back through the cell.

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, a "photoactive region" refers to a region of the device that absorbs electromagnetic radiation to generate excitons. Similarly, a layer is "photoactive" if it absorbs electromagnetic radiation to generate excitons. The excitons may dissociate into an electron and a hole in order to generate an electrical current.

As used herein, the terms "donor" and "acceptor" refer to the relative positions of the highest occupied molecular orbital ("HOMO") and lowest unoccupied molecular orbital ("LUMO") energy levels of two contacting but different organic materials. It is energetically favorable, in the absence of an external bias, for electrons at a donor-acceptor junction to move into the acceptor material, and for holes to move into the donor material.

As used herein, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Because ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, the term "band gap" (Eg) of a polymer may refer to the energy difference between the HOMO and the LUMO. The band gap is typically reported in electronvolts (eV). The band gap may be measured from the UV-vis spectroscopy or cyclic voltammetry. A "low band gap" polymer may refer to a polymer with a band gap below 2 eV, e.g., the polymer absorbs light with wavelengths longer than 620 nm.

As used herein, the term "excitation binding energy" ($E_B$) may refer to the following formula: $E_B=(M^++M^-)-(M^*+M)$, where $M^+$ and $M^-$ are the total energy of a positively and negatively charged molecule, respectively; $M^*$ and $M$ are the molecular energy at the first singlet state (Si) and ground state, respectively. Excitation binding energy of acceptor or donor molecules affects the energy offset needed for efficient exciton dissociation. In certain examples, the escape yield of a hole increases as the HOMO offset increases. A decrease of exciton binding energy $E_B$ for the acceptor molecule leads to an increase of hole escape yield for the same HOMO offset between donor and acceptor molecules.

As used herein, power conversion efficiency ($\eta_p$) may be expressed as:

$$\eta_p = \frac{V_{OC}*FF*J_{SC}}{P_O}$$

wherein $V_{OC}$ is the open circuit voltage, FF is the fill factor, $J_{SC}$ is the short circuit current, and $P_O$ is the input optical power.

Figure 1B:
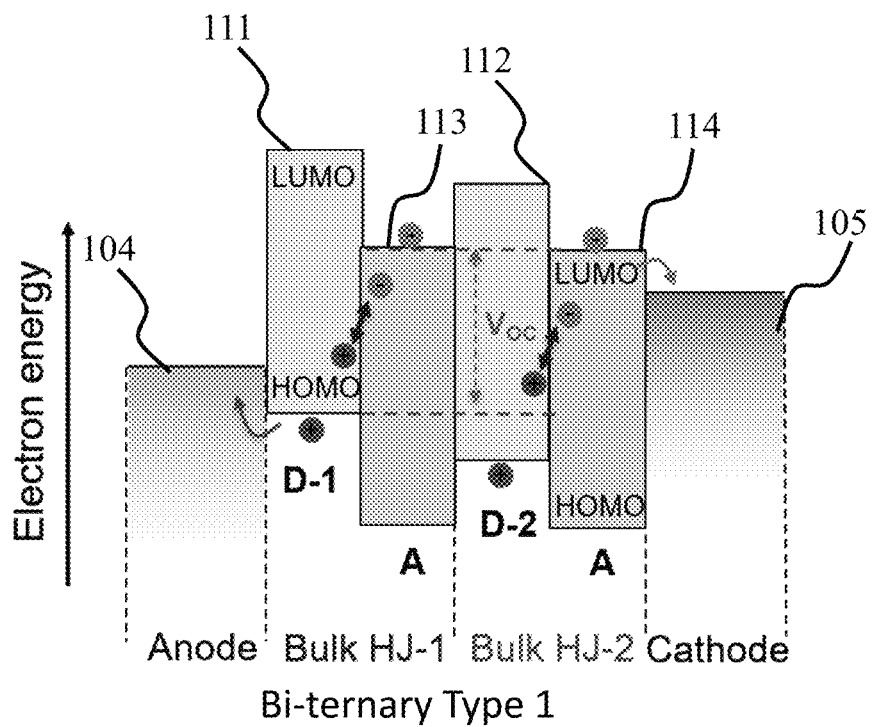
FIG. 1B is an energy level diagram of a type-1 bi-ternary OPV cell.
Figure 1C:
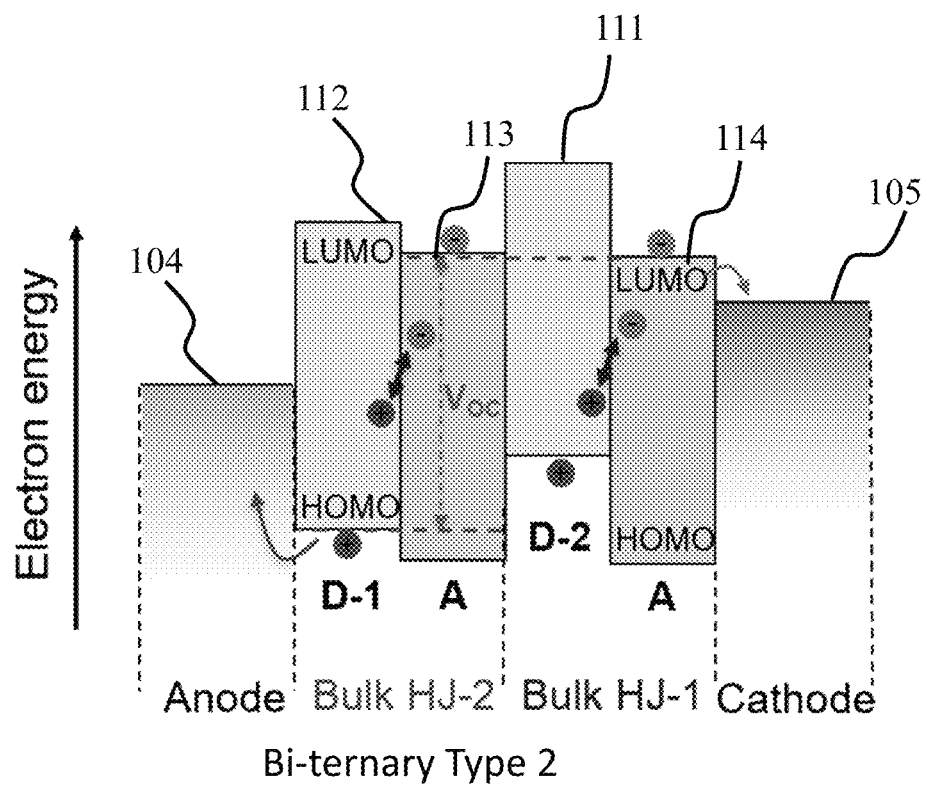
FIG. 1C is an energy level diagram of a type-2 bi-ternary OPV cell.

Embodiments of the disclosure are directed to a small molecule-based bi-ternary OPV comprising two individual, vacuum deposited binary bulk heterojunctions fused at a planar junction without component intermixing. This structure may be referred to interchangeably herein as a bi-layer ternary OPV or a bi-ternary OPV. Exemplary bi-ternary OPVs are shown in FIG. 1B and FIG. 1C. In some embodiments, the open circuit voltage ($V_{OC}$) of an exemplary bi-ternary OPV corresponds to one of the constituent binaries, depending on the order in which they are stacked relative to the anode. Additionally, dipole-induced energy-level realignment between the two binary segments necessary to achieve maximum efficiency is observed when using donor-acceptor-acceptor' dipolar donors in the photoactive heterojunctions. The optimized bi-ternary OPV shows improved performance compared to its two constituent binary OPVs, achieving a power conversion efficiency of 10.6±0.3% under AM 1.5G 1 sun (100 mW/cm$^2$) simulated illumination with $V_{OC}$=0.94±0.01 V, a short circuit current density of 16.0±0.5 mA cm$^{-2}$ and a fill factor of 0.70±0.01.

With reference now to FIG. 1B, an electron energy diagram of the subsequent layers is shown. The stacked sub-elements comprise two different donor molecules 111 and 112, but share a common, fullerene acceptor 113/114. This device is analogous to a tandem cell where the charge generation layer between sub-elements is eliminated, since the common acceptor 113/114 allows for uninterrupted transport of photogenerated electrons across the entire active region. Additionally, dipole-induced energy-level alignment between the two binaries is obtained using donor-acceptor-acceptor' (d-a-a') donors in the photoactive HJ, thus allowing for hole transport between sub-elements. Finally, the $V_{OC}$ of the bi-ternary OPV corresponds to that of the binary sub-element placed nearest to the anode contact 104. An alternative arrangement with the donor material layers 111 and 112 in reversed order is shown in FIG. 1C.

Although exemplary embodiments are described herein as using a fullerene acceptor material, it is understood that any suitable acceptor material may be used, including non-fullerene acceptor materials.

In contrast to a ternary cell whose $V_{OC}$ lies between that of the two binaries, the bi-ternary stacking order can be adjusted to give the highest possible $V_{OC}$ and hence, PCE. As a result, optimized bi-ternary OPVs consistently show improved performance compared to the two constituent binary devices, achieving PCE=10.6±0.3% under AM 1.5G 1 sun (100 mW/cm$^2$) simulated illumination, with $V_{OC}$=0.94±0.01 V, a short circuit current density of $J_{SC}$=16.0±0.5 mA cm$^{-2}$, and a fill factor of FF=0.70±0.01.

Any donor molecule may be useful within the devices of the present disclosure, as would be understood by one of ordinary skill in the art. Non-limiting examples of useful donor molecules include phthalocyanines, such as copper phthalocyanine(CuPc), chloroaluminium phthalocyanine (ClAlPc), tin phthalocyanine (SnPc), zinc phthalocyanine (ZnPc), and other modified phthalocyanines, subphthalocyanines, such as boron subphthalocyanine (SubPc), naphthalocyanines, merocyanine dyes, boron-dipyrromethene (BODIPY) dyes, diindenoperylene (DIP), squaraine (SQ) dyes, tetraphenyldibenzoperiflanthene (DBP), 2-((7-(5-(diptolylamino)thiophen-2-yl)benzo[c][1,2,5]thiadiazol-4-yl) methylene)malononitrile (DTDCTB), 2 is (2-[(7-(4-[N,N-bis(4-methylphenyl)amino]phenyl)2,1,3-benzothia-diazol-4-yl) methylene]propane-dinitrile) (DTDCPB), 2-((7-(N-(isobutyl)-benzothieno[3,2-b]thieno[2,3-d]-pyrrol-2-yl) benzo[c][1,2,5] thiadiazol-4-yl)methylene)malononitrile (iBuBTDC), 2-{[2-(4-N,N-ditolylaminophenyl)-pyrimidin-5-yl]methylene}malononitrile (DTDCPP), and derivatives thereof. Examples of squaraine donor materials include but are not limited to 2,4-bis [4-(N,N-dipropylamino)-2,6-dihydroxyphenyl] squaraine, 2,4-bis[4-(N,N-diisobutylamino)-2,6-dihydroxyphenyl] squaraine, 2,4-bis[4-(N,N-diphenylamino)-2,6-dihydroxyphenyl] squaraine (DPSQ). Additional non-limiting examples of useful donor molecules can be found in US 2016/0343966, filed Jan. 15, 2015 and which is incorporated by reference herein in its entirety. In one embodiment, the donor molecule is DTDCPB. In another embodiment, the donor molecule is iBuBTDC. In one embodiment, the donor molecule is DTDCPP. In one embodiment, the donor molecule is DPB. In one embodiment, the donor molecule is SubPc.

In one embodiment, a binary heterojunction layer includes a donor mixed with a small-molecule acceptor material. Suitable examples of small-molecule acceptor materials for use in the presently disclosed devices include, but are not limited to, fullerenes and fullerene derivatives (e.g., PCBMs, ICBA, ICMA, etc.). Non-limiting mention is made to those chosen from $C_{60}$, $C_{70}$, $C_{76}$, $C_{82}$, $C_{84}$, or derivatives thereof such as [6,6]-Phenyl-$C_{61}$-Butyric-Acid-Methyl Ester ([60]PCBM), [6,6]-Phenyl-$C_{71}$-Butyric-Acid-Methyl Ester ([70]PCBM), or Thienyl-$C_{61}$-Butyric-Acid-Methyl Ester ([60]ThCBM), and other acceptors such as 3,4,9,10-perylenetetracarboxylic-bisbenzimidazole (PTCBI), hexadecafluorophthalocyanine ($F_{16}$CuPc), and derivatives thereof. In one embodiment, the donor is mixed with a fullerene. In one embodiment, the fullerene is $C_{60}$ or $C_{70}$. In one embodiment, the layer comprises DTDCPB and $C_{70}$. In one embodiment, the layer comprises iBuBTDC and $C_{70}$. In one embodiment, the layer comprises DTDCPP and $C_{70}$. In one embodiment, the layer comprises DPB and $C_{70}$. In one embodiment, the layer comprises SubPc and $C_{70}$.

In one embodiment, with reference to one or more of the embodiments above, a ratio of the mixture of donor molecule and fullerene is in a range from 8:1 to 1:8. In one embodiment, the ratio of donor molecule and fullerene is in a range from 3:1 to 1:3. In one embodiment, the ratio of donor molecule and fullerene is about 1:2. In one embodiment, the ratio of donor molecule and fullerene is about 1:3. In one embodiment, the ratio of donor molecule and fullerene is about 1:8.

In one embodiment, the anode and/or the cathode is a conductive metal oxide, a metal layer, or a conducting polymer. Non-limiting examples of the conductive metal oxide include indium tin oxide, tin oxide, gallium indium tin oxide, zinc oxide, or zinc indium tin oxide. Non-limiting examples of the metal layer include Ag, Au, Pd, Pt, Ti, V, Zn, Sn, Al, Co, Ni, Cu, Cr, or combinations thereof. Non-limiting examples of the conductive polymer include polyanaline (PANI), or 3,4-polyethyl-enedioxythiophene:polystyrenesulfonate (PEDOT:PSS). In one embodiment, the conductive polymer is transparent.

The multi-junction devices of the present disclosure may further comprise additional layers known in the art for photovoltaic devices, such as various buffer layers. For example, the devices may further comprise charge collection/transporting layers. Charge collection/transporting layers may be located, e.g., between a subcell and an electrode and/or between a subcell and a separating layer. It should be understood that charge collection/transporting layers will be chosen according to the desired carrier to be collected/transported. Examples of charge collecting/transporting layers include, but are not limited to, metal oxides. In certain embodiments, the metal oxides are chosen from $MoO_3$, $V_2O_5$, ZnO, and $TiO_2$.

As a further example, the devices may include exciton-blocking layers, including exciton-blocking charge-carrier filters, in addition to any exciton-blocking charge-carrier filters present in the separating layers. With regard to materials that may be used as an exciton blocking layer, non-limiting mention is made to those chosen from bathocuproine (BCP), bathophenanthroline (BPhen), 1,4,5,8-Naphthalene-tetracarboxylic-dianhydride (NTCDA), 3,4,9, 10-perylenetetracarboxylicbis-benzimidazole (PTCBI), 1,3, 5-tris(N-phenylbenzimidazol-2-yl)benzene (TPBi), tris (acetylacetonato) ruthenium(III) (Ru(acac)3), and aluminum (III)phenolate (Alq2 OPH), N,N'-diphenyl-N,N'-bis-alphanaphthylbenzidine (NPD), aluminum tris(8-hydroxyquinoline) (Alq3), and carbazole biphenyl (CBP). In one embodiment, the material is BPhen.

These buffer layers may also serve as optical spacers to control the optical field distribution in the multi-junction devices according to the design considerations disclosed herein.

Layers and materials may be deposited using techniques known in the art. For example, the layers and materials described herein can be deposited or co-deposited from a solution, vapor, or a combination of both. In some embodiments, organic materials or organic layers are deposited or co-deposited using vacuum thermal evaporation, organic vapor phase deposition, or organic vapor-jet printing.

While exemplary embodiments are described herein including two binary bulk heterojunctions, it is understood that methods and embodiments of the present disclosure may include three, four, five, or more binary bulk heterojunctions positioned between an anode and a cathode.

Figure 2:
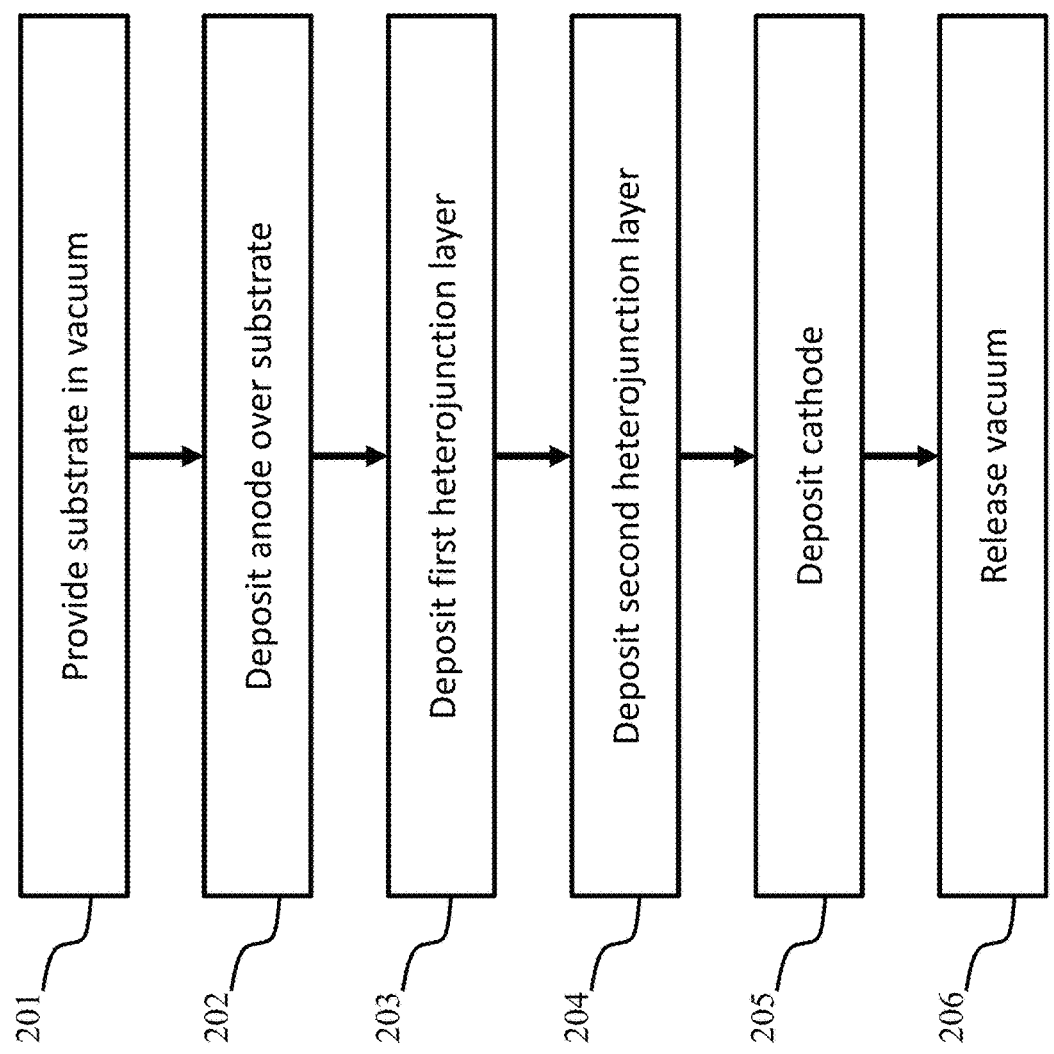
FIG. 2 is a method of making a photovoltaic cell.

With reference now to FIG. 2, a method of making a photovoltaic cell is shown. The method comprises the steps of providing a substrate in a vacuum in step 201, depositing an anode over the substrate in step 202, depositing a first heterojunction layer over the anode layer in step 203, depositing a second heterojunction layer over the first heterojunction layer in step 204, depositing a cathode over the second heterojunction layer in step 205, and releasing the vacuum in step 206.

Experimental Examples

The disclosure is further described in detail by reference to the following experimental examples. These examples are provided for purposes of illustration only, and are not intended to be limiting unless otherwise specified. Thus, the disclosure should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present disclosure. The following working examples therefore, specifically point out the exemplary embodiments of the present disclosure, and are not to be construed as limiting in any way the remainder of the disclosure.

Figure 3A:
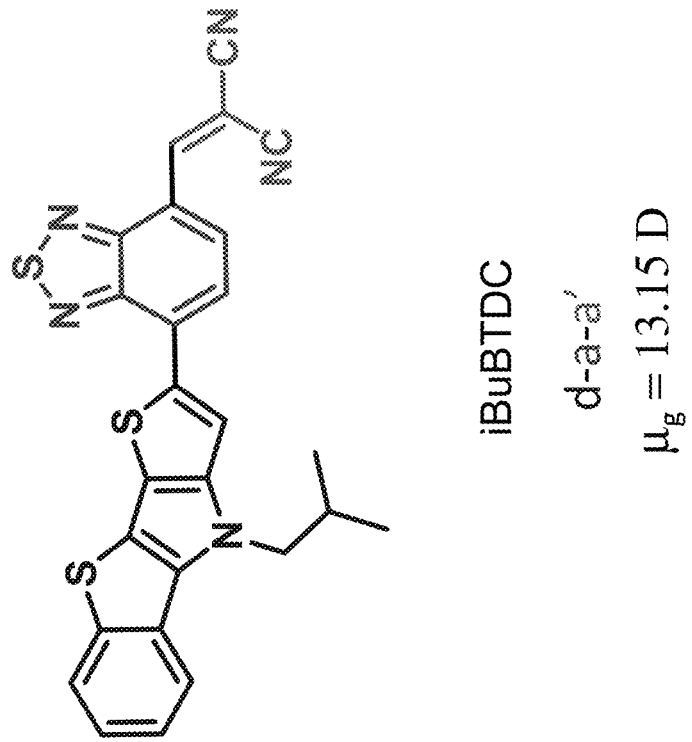
FIG. 3A is molecular structural formulae of DTDCPB and iBuBTDC.
Figure 3A:
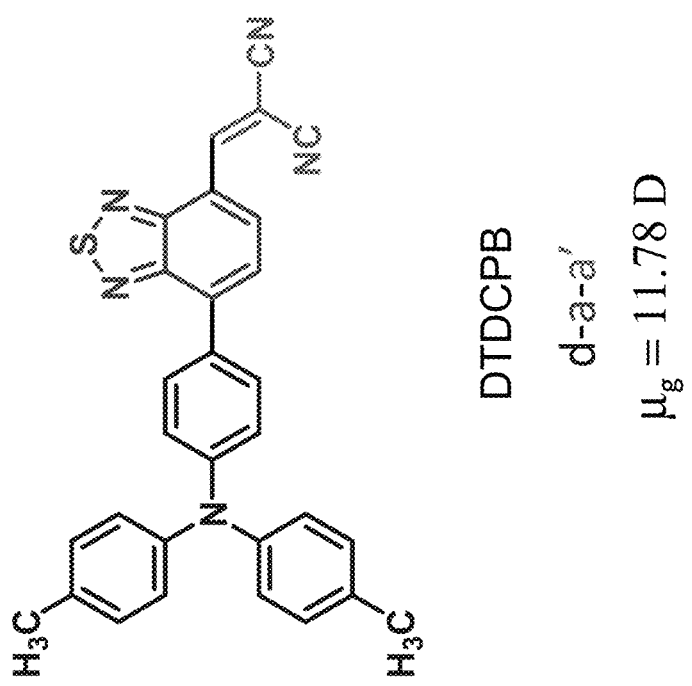

A bi-ternary OPV structure was produced incorporating two sequentially vacuum-deposited segments, one comprising a (2-[(7-(4-[N,N-bis(4-methylphenyl)amino]phenyl)2,1,3-benzothia-diazol-4-yl)methylene]propane-dinitrile) (DTDCPB) donor, and the second a 2-((7-(N-(isobutyl)-benzothieno[3,2-b]thieno[2,3-d]-pyrrol-2-yl)benzo[c][1,2,5] thiadiazol-4-yl) methylene)malononitrile (iBuBTDC) donor both intermixed with a $C_{70}$ acceptor in the photoactive layers. The molecular structures of the two asymmetric donors are shown in FIG. 3A.

The donor molecules followed the structure of an electron donating (d) unit attached to two, linearly disposed electron accepting (a, a') units. The internal dipole moments of the ground states ($\mu_g$) were calculated using density functional theory, with results provided in Table 1. The iBuBTDC molecule showed a larger ground state dipole moment of $\mu_g$=13.15 D compared to DTDCPB with $\mu g$=11.78 D.

TABLE 1

| Dye | $\lambda_{abs}$ [nm] | ε [cm$^{-1}$] | $\lambda_{onset}$ [nm] | HOMO [eV] | LUMO [eV] | $\Delta E^{opt}$ [eV] | μ [D] |
|---|---|---|---|---|---|---|---|
| DTDCPB | 570 | 157000 | 699 | −5.27 | −3.62 | 1.65 | 11.78 |
| iBuBTDC | 620 | 296000 | 810 | −5.35 | −3.82 | 1.53 | 13.15 |

Figure 3B:
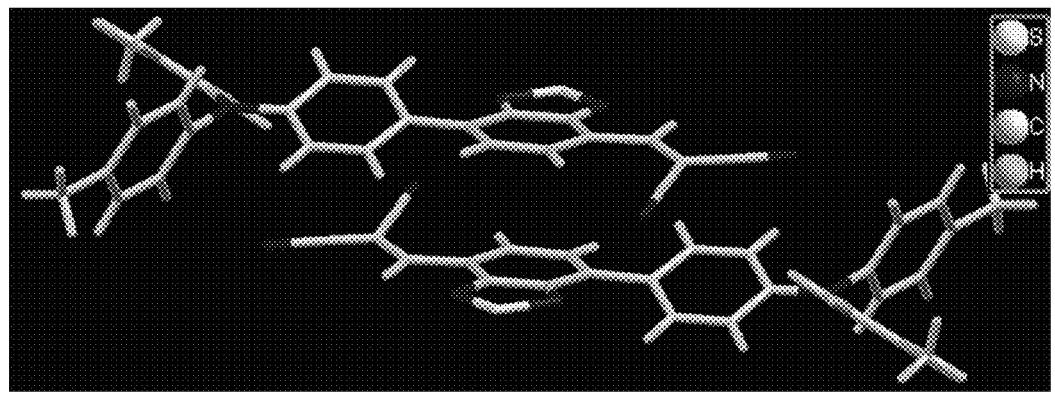
FIG. 3B and FIG. 3C are molecular structures and crystal packing habits of DTDCPB and iBuBTDC.
Figure 3C:
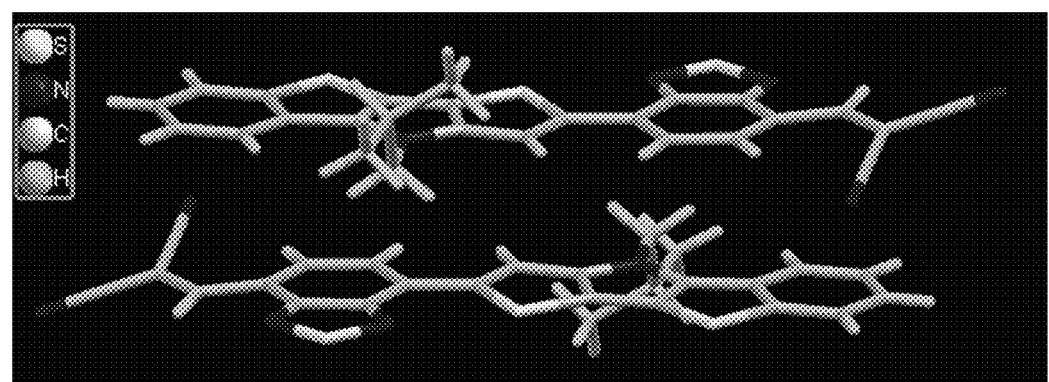

Crystal structures of DTDCPB and iBuBTDC obtained from x-ray diffraction are shown in FIG. 3B and FIG. 3C, respectively. The DTDCPB was distorted from planarity with a dihedral angle between the phenylene and benzothiadiazole (BT) rings of 24.7° due to ortho-ortho steric interactions, whereas iBuBTDC had a coplanar conformation with a dihedral angle of 3.4° between the hetero-tetracene and benzothiadiazole rings. Both molecules formed antiparallel stacks and self-assembled into centrosymmetric dimers. The arrangement of two neighboring BT rings with an intermolecular distance of 3.55 Å was due to strong electrostatic interactions that facilitated charge hopping in the solid state.

Figure 4B:
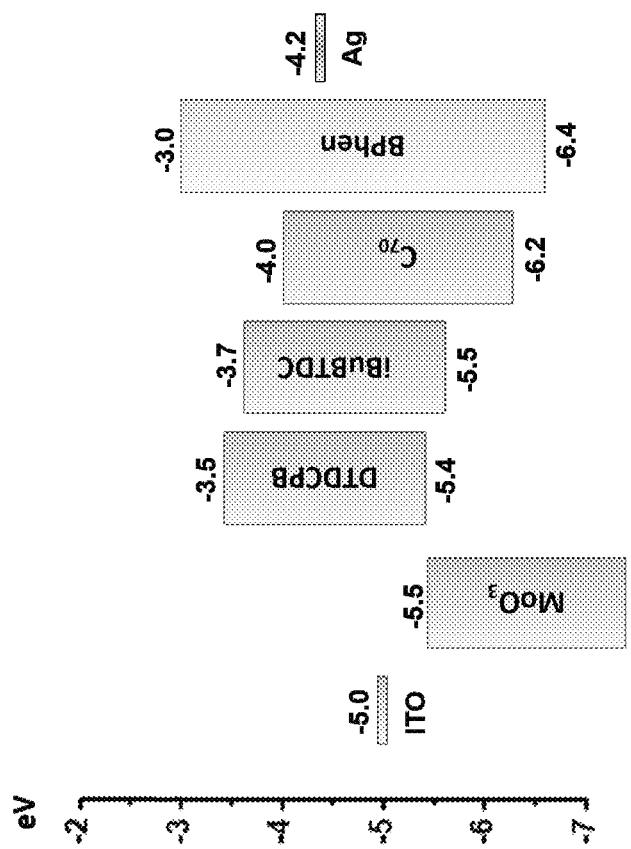
FIG. 4B is Energy level diagrams of the materials used in bi-ternary OPVs based on DTDCTB:$C_{70}$ and iBuBTDC:$C_{70}$.
Figure 4A:
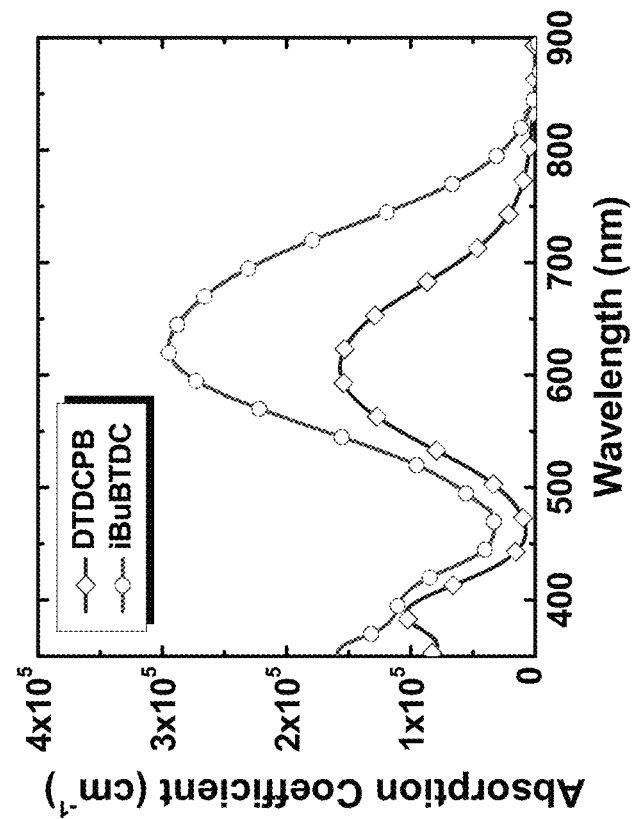
FIG. 4A is absorption spectra of DTDCPB and iBuBTDC thin films.

FIG. 4A shows that the absorption spectrum of iBuBTDC was red shifted by 40 nm relative to DTDCPB, together with an increase in the peak molar extinction coefficient (F). This was due to the longer conjugation attributed to the quinoidal character of thiophene moiety as well as the coplanar conformation of iBuBTDC that lowered its energy gap and increased the oscillator strength. Cyclic voltammetry (CV) was used to obtain the highest occupied and the lowest unoccupied molecular orbital energies ($E_{HOMO}$ and $E_{LUMO}$, respectively) of −5.35±0.05 eV and −3.82±0.06 eV, respectively, for iBuBTDC, and −5.27±0.06 eV and −3.62±0.06 eV, respectively, for DTDCPB (see Table 1 and FIG. 4B). The iBuBTDC had a HOMO-LUMO energy gap of 1.53 eV vs. 1.65 eV for DTDCPB. Ultraviolet photoelectron spectroscopy (UPS) was used to obtain ionization energy (IE) =−5.50±0.09 eV for iBuBTDC, and −5.40±0.09 eV for DTDCPB, which agreed with $E_{HOMO}$ variation from the CV measurements. In the context of Hartree-Fock calculations, following Koopmans' theorem, the $E_{HOMO}$ can be considered as (minus) the vertical ionization potential.

Since iBuBTDC and DTDCPB have different HOMO energies, there are two possible binary stacking arrangements in the bi-ternary. The first configuration was to place the DTDCPB:$C_{70}$ segment with the shallower $E_{HOMO}$ closest to the anode. As a result, holes encountered a cascade energy landscape as shown in FIG. 1B and were likely to exothermically transfer from iBuBTDC to DTDCPB to the anode. This bi-ternary configuration is denoted as a type-1 (or "right way") bi-ternary. The opposite stacking order apparently presented a hole barrier between sub-element nearest the cathode and that adjacent to the anode, is thus termed a type-2 (or "wrong way") bi-ternary (see FIG. 1C).

Figure 5B:
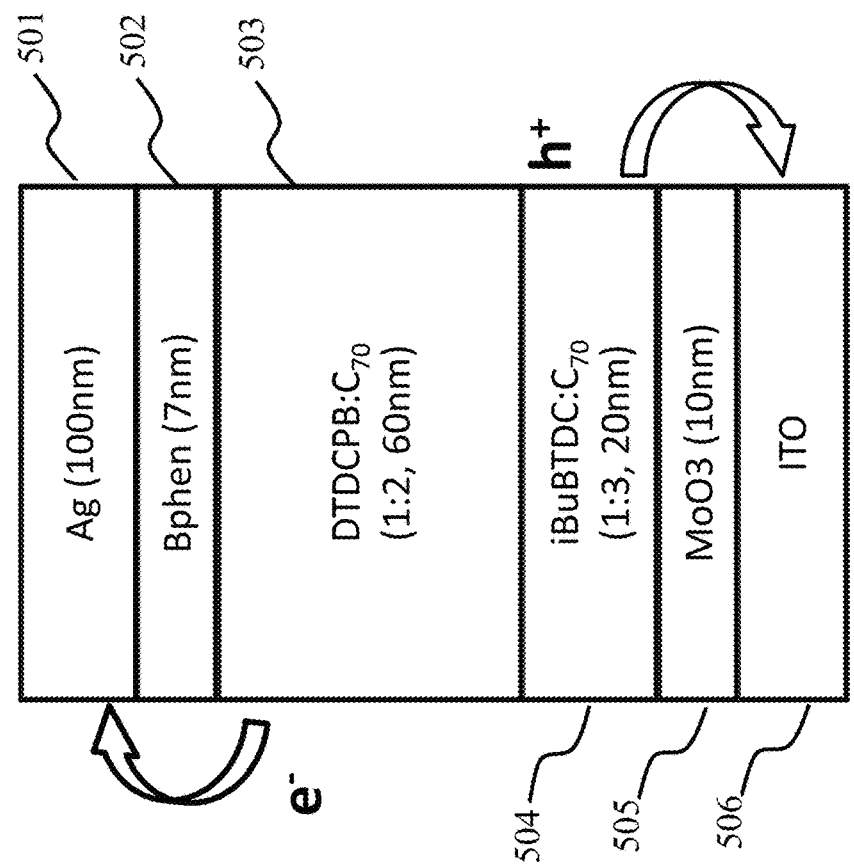
FIG. 5B is a schematic of a type-2 (wrong way) bi-ternary OPV showing layer thicknesses and compositions.
Figure 5A:
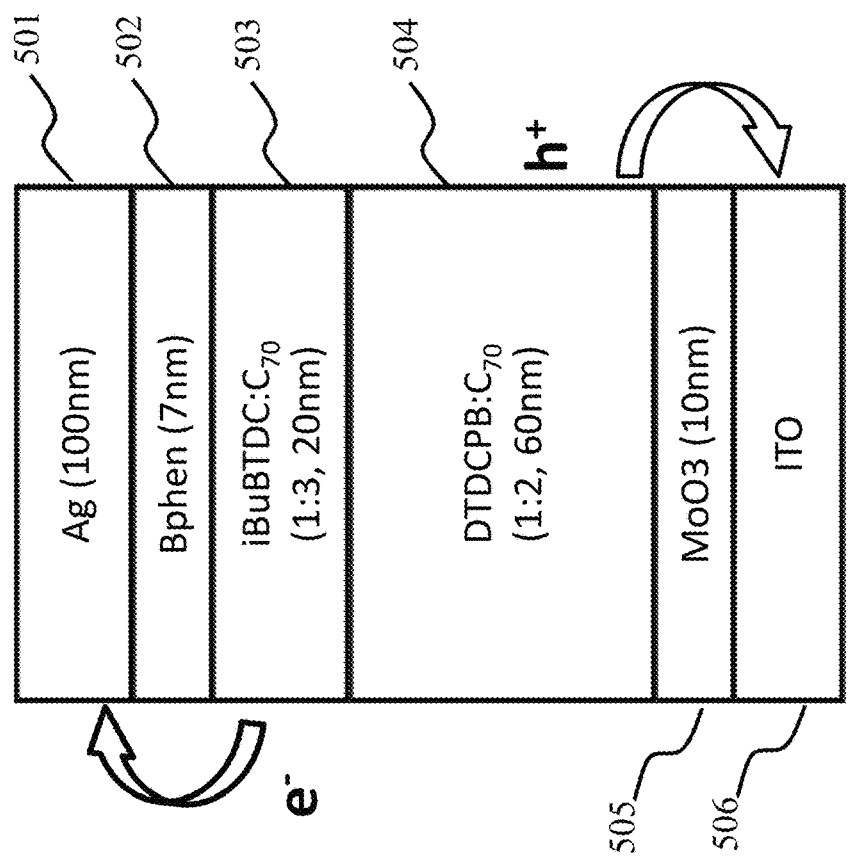
FIG. 5A is a schematic of a type-1 (right way) bi-ternary OPV showing layer thicknesses and compositions.

The optimized type-1 ("right way") bi-ternary OPV in FIG. 5A had the following structure: an anode 506 comprising indium tin oxide (ITO), a 10 nm MoO$_3$ layer 505, a 60 nm DTDCPB:$C_{70}$ (1:2) layer 504, a 20 nm iBuBTDC:$C_{70}$ (1:3) layer 503, a 7 nm bathophenanthroline (BPhen) layer 502, and a 100 nm Ag cathode 501. The type-2 ("wrong way") structure replaced the active region with the reverse order of donors of iBuBTDC:$C_{70}$ (1:3, 20 nm)/DTDCPB:$C_{70}$ (1:2, 60 nm) (see FIG. 5B). For comparison, two binary cells were also fabricated with the following structures: ITO/MoO$_3$ (10 nm)/DTDCPB:$C_{70}$ (1:2, 80 nm) or iBuBTDC:$C_{70}$ (1:3, 80 nm)/BPhen (7 nm)/Ag (100 nm). Fabrication details are discussed in detail below.

Results

Figure 6:
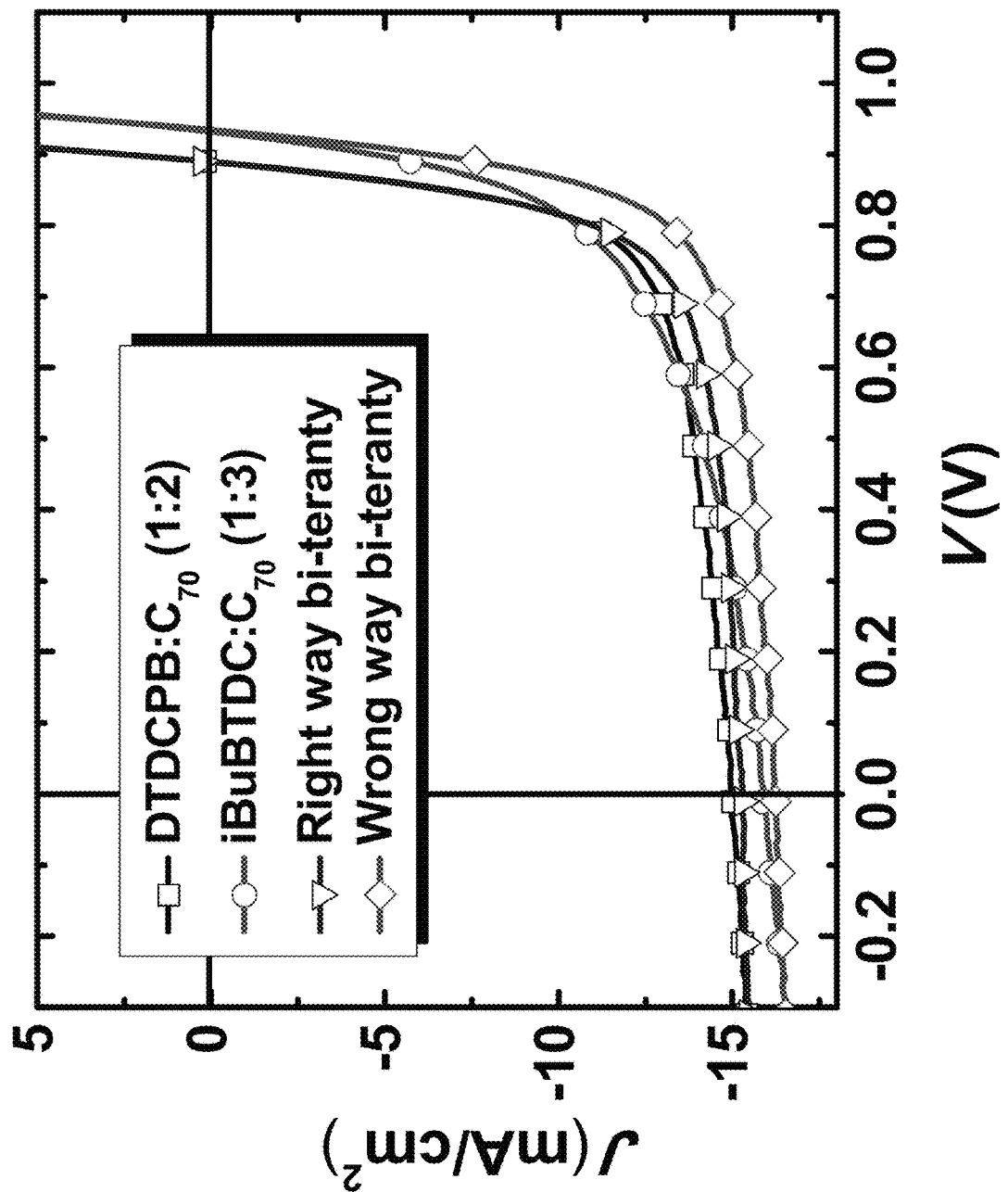
FIG. 6 is a graph of current-density-voltage characteristics of bi-ternary and constituent binary cells.

The current density-voltage (J-V) characteristics of the two device types are plotted in FIG. 6, with a summary of their performance in Table 2 below. All reported device performance characteristics were measured under simulated 1 sun AM1.5G solar spectral illumination, 100 mW/cm². Both right and wrong way bi-ternary OPVs achieved higher PCEs and fill factors (FFs) compared to the individual binary devices. The optimized wrong way cell had PCE=10.6±0.3%, which was the highest reported efficiency for a thermally evaporated, small molecule OPV. Its right way counterpart had PCE=9.6±0.3%. Interestingly, the $V_{OC}$ of the bi-ternary OPV was pinned to that of the binary sub-element nearest to the anode. Hence, $V_{OC}$=0.94±0.01 V for the wrong way, compared to 0.90±0.01 V for the right way OPV. Also, the wrong way bi-ternary showed $J_{SC}$=16.0±0.5 versus 15.3±0.4 mA cm⁻² for the right way cell.

TABLE 2

| | $J_{sc}^a$ [mA/cm²] | $V_{OC}$ [V] | FF [%] | PCE [%] |
|---|---|---|---|---|
| DTDCPB:C₇₀ (1:2) | 15.0 ± 0.4 | 0.90 ± 0.01 | 68.5 ± 1.2 | 9.2 ± 0.3 |
| iBuBTDC:C₇₀ (1:3) | 15.9 ± 0.4 | 0.94 ± 0.01 | 59.0 ± 1.0 | 8.7 ± 0.2 |
| Bi-ternary (Type-1) | 15.3 ± 0.4 | 0.90 ± 0.01 | 70.2 ± 1.2 | 9.6 ± 0.3 |
| Bi-ternary (Type-2) | 16.0 ± 0.5 | 0.94 ± 0.01 | 70.3 ± 1.2 | 10.6 ± 0.3 |

The $J_{SC}$ values in Table 2 above are calculated from the integral of the EQE spectrum. The average PCE value above is based on measurement of 16 devices.

Figure 7A:
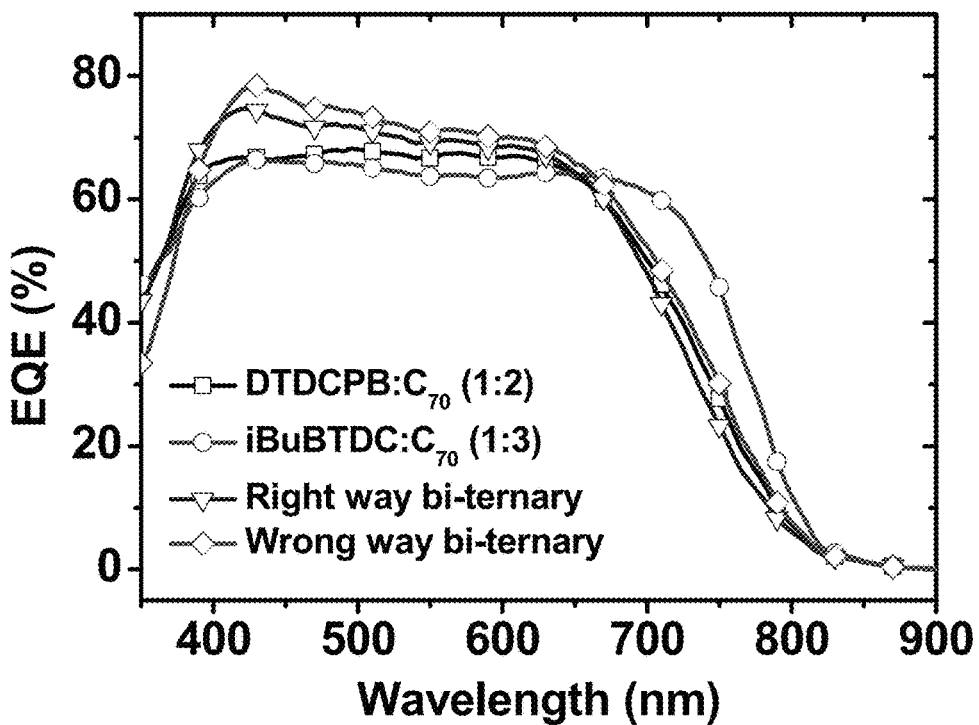
FIG. 7A is a graph of external quantum efficiency (EQE) spectra of the bi-ternary and binary cells.
Figure 7B:
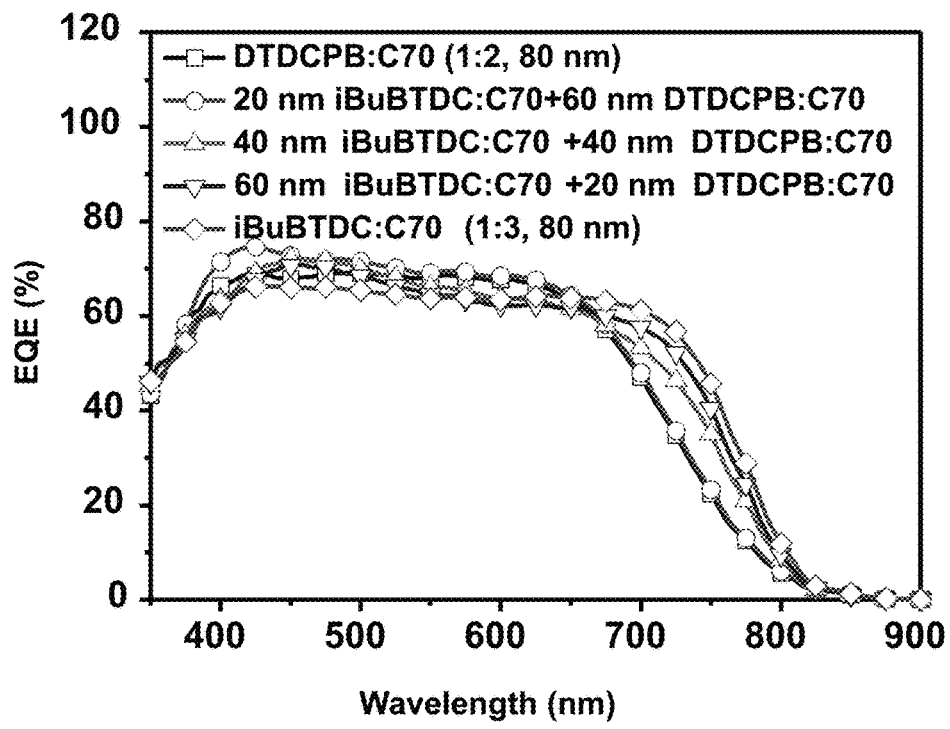
FIG. 7B is a graph of external quantum efficiency (EQE) spectra of the wrong way bi-ternary devices with different thickness of sub-elements.

FIG. 7A shows the external quantum efficiencies (EQE) vs. wavelength for the bi-ternary OPVs along with those of the individual binary OPVs. Significant improvements in EQE>70% of both bi-ternaries between =400 nm and 700 nm were achieved at an active layer thickness of 80 nm for each configuration. The performance trends of the bi-ternary OPVs vs. thickness are provided in FIG. 7B.

Figure 8A:
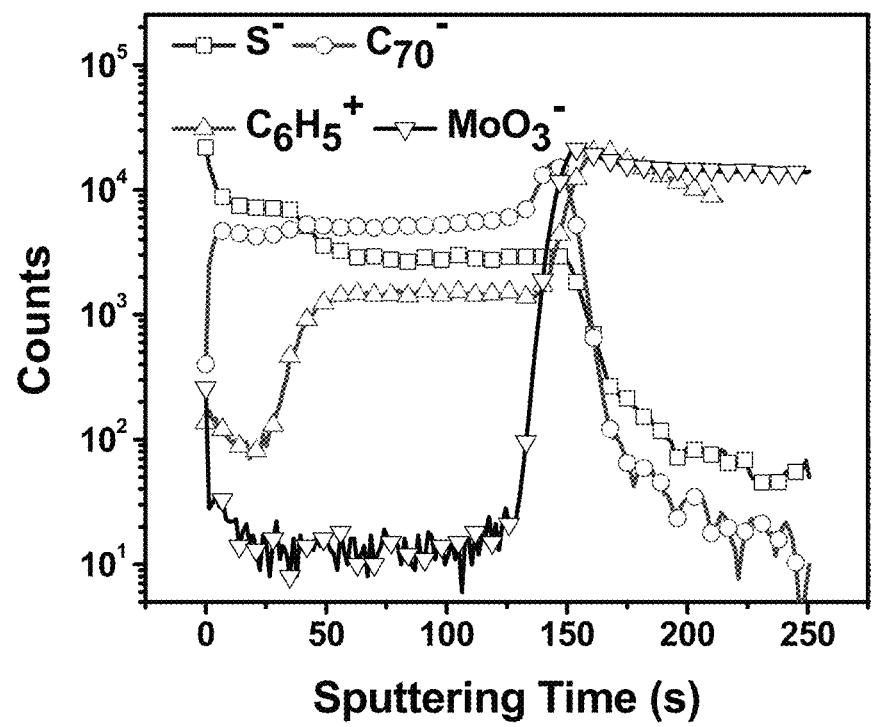
FIG. 8A is a graph of time of flight secondary-ion mass spectra (SIMS) of a right way bi-ternary device comprising a DTDCPB:$C_{70}$ bottom layer and iBuBTDC:$C_{70}$ top layer.
Figure 8B:
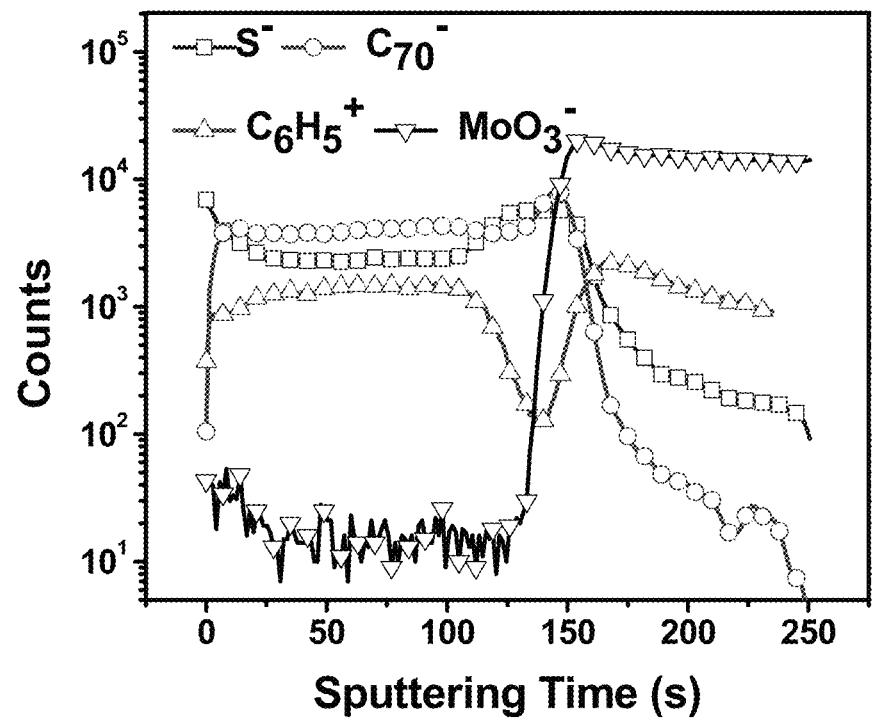
FIG. 8B is a graph of time of flight secondary-ion mass spectra (SIMS) of a wrong way bi-ternary device comprising a iBuBTDC:$C_{70}$ bottom layer and DTDCPB:$C_{70}$ top layer.
Figure 8D:
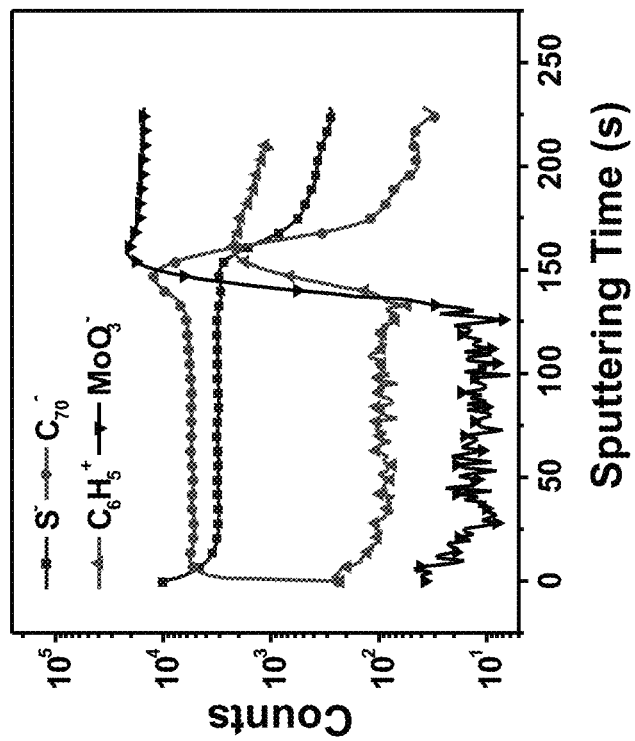
FIG. 8D is a graph of time of flight secondary-ion mass spectroscopy (SIMS) of a binary device comprising iBuBTDC:$C_{70}$.
Figure 8C:
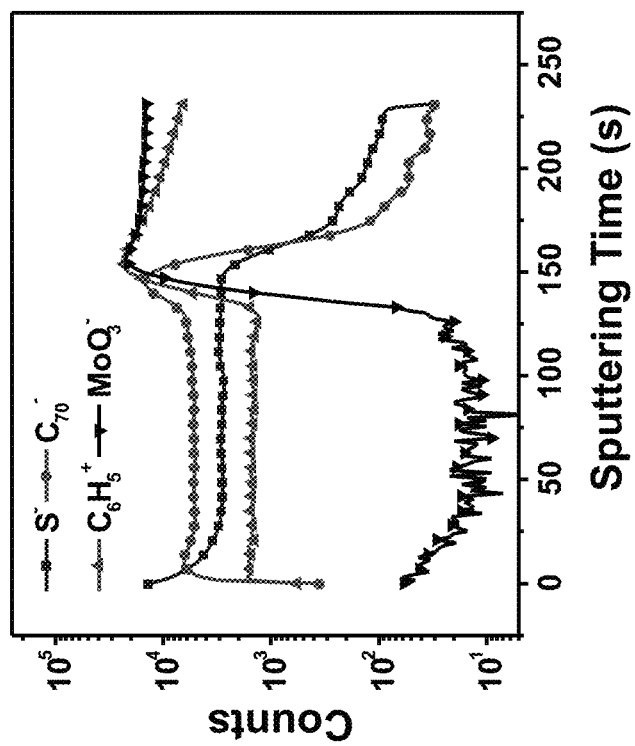
FIG. 8C is a graph of time of flight secondary-ion mass spectroscopy (SIMS) of a binary device comprising DTDCPB:$C_{70}$.

Time of flight secondary-ion mass spectroscopy (SIMS) was used to explore the vertical composition gradients of the bi-ternary and binary blends, with results shown in FIG. 8A, FIG. 8B, FIG. 8C, and FIG. 8D. FIG. 8A shows time of flight secondary-ion mass spectra (SIMS) of a right way bi-ternary device comprising a DTDCPB:C₇₀ bottom layer and iBuBTDC:C₇₀ top layer. FIG. 8B shows results from a wrong way bi-ternary device comprising a iBuBTDC:C₇₀ bottom layer and DTDCPB:C₇₀ top layer. FIG. 8C shows time of flight secondary-ion mass spectroscopy (SIMS) of a binary device comprising DTDCPB:C₇₀, while FIG. 8D shows time of flight secondary-ion mass spectroscopy (SIMS) of a binary device comprising iBuBTDC:C₇₀.

The MoO₃⁻ cation was selected as a reference. In the wrong way OPV, a constant count of the phenyl cation from DTDCPB was obtained for nearly 100 s sputtering time, corresponding to a film depth of 60 nm assuming a measured sputtering rate of ~0.6 nm/s. After 100 s, there was an increase in the S⁻ anion from iBuBTDC, which was observed over the next 35 s. In contrast, S⁻ was first observed in the right way configuration, followed by the phenyl cation over the next 100 s. The C₇₀ anion showed a nearly constant signal intensity across the entire bi-ternary active region. These results indicated the existence of a sharp interface between two sub-binaries in both the type 1 and 2 structures.

Discussion

Figure 9B:
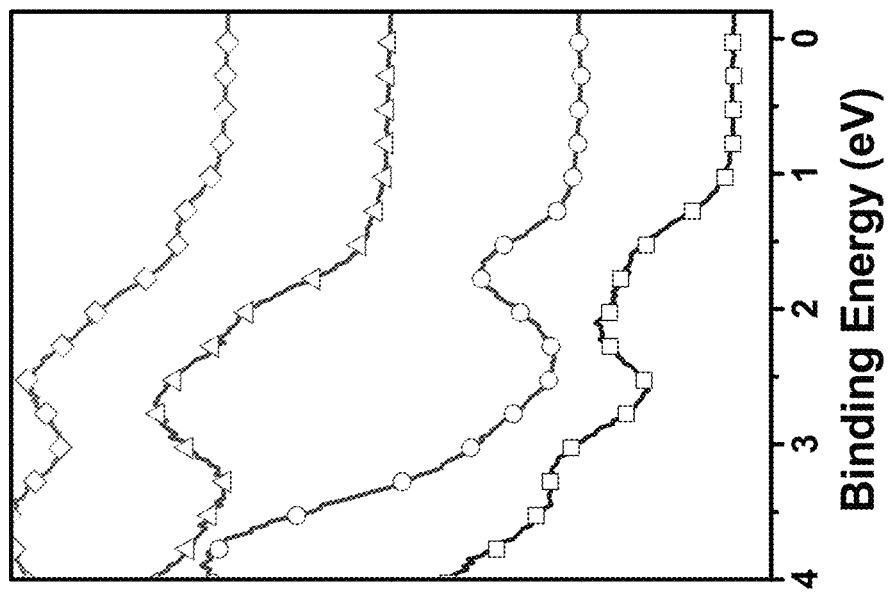
FIG. 9A and FIG. 9B are ultraviolet photoelectron spectra (UPS) of DTDCPB, iBuBTDC films, as well as mixed blends with $C_{70}$.
Figure 9A:
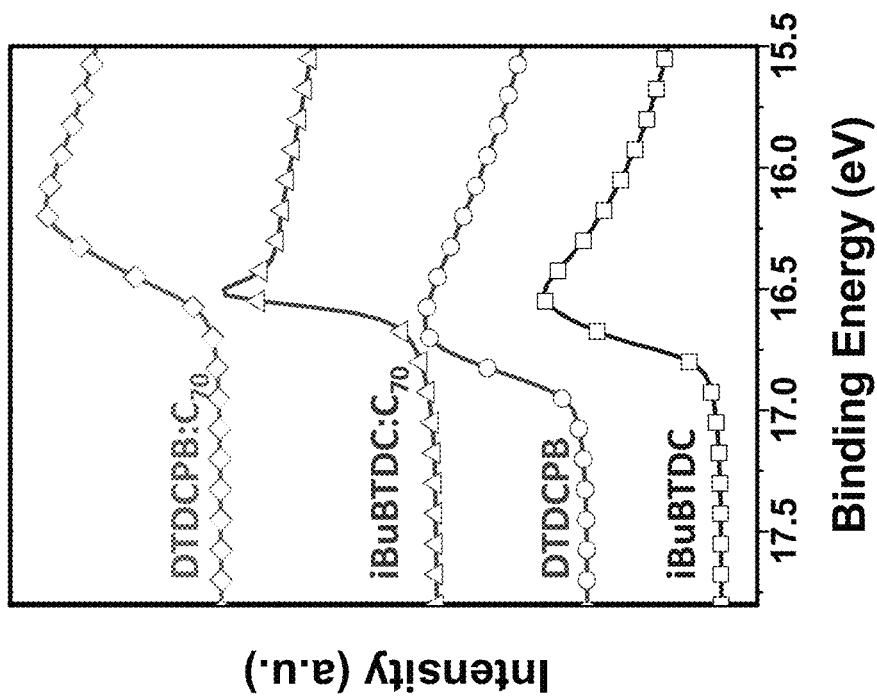
Figure 9C:
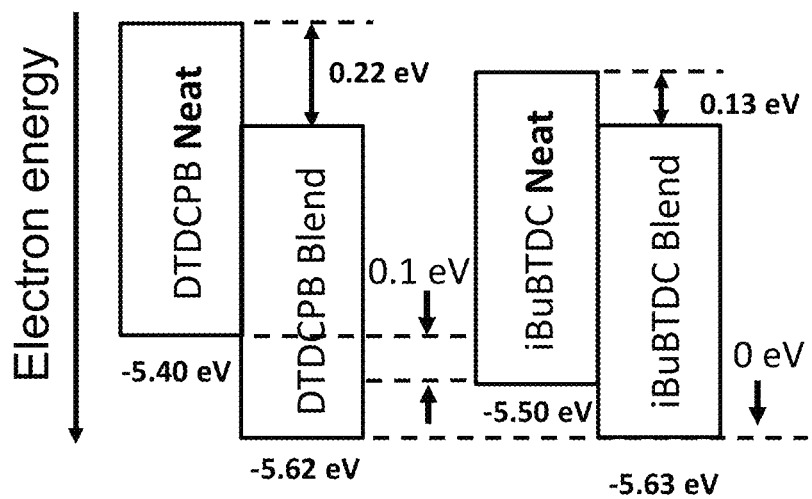
FIG. 9C is an energy-level diagram extracted from UPS measurements of DTDCPB, iBuBTDC films and mixed blends with $C_{70}$.

Contrary to expectations, higher performance was obtained when there was an apparent energy barrier to holes imposed by the binary sub-element between the anode and the second sub-element (i.e. the wrong way bi-ternary). This was explained from measurements of $E_{HOMO}$ of the donors collected by both CV and UPS (see spectra, FIG. 9A and FIG. 9B), each of which showed that the HOMO energy of iBuBTDC was deeper than that of DTDCPB. In the wrong way device, the holes were forced to hop back from DTDCPB to the deeper $E_{HOMO}$ of iBuBTDC. In FIG. 9C it is apparent that placing iBuBTDC adjacent to the anode presented a 100 meV energy barrier to hole transport, which increased charge recombination and decreased $J_{SC}$ and FF. However, UPS measurements showed that the $E_{HOMO}$ of the donors underwent a shift of 0.22±0.09 eV for DTDCPB in the DTDCPB:C₇₀ blend, and 0.13±0.09 eV for iBuBTDC in the iBuBTDC:C₇₀ blend (see FIG. 9A and FIG. 9B). As a result, the energy barrier that otherwise would exist between the HOMOs of iBuBTDC and DTDCPB was eliminated, allowing holes to efficiently transport between the donors at the iBuBTDC:C₇₀ and DTDCPB:C₇₀ interface regardless of whether the bi-ternary of was in the type 1 or 2 configuration.

Figure 10A:
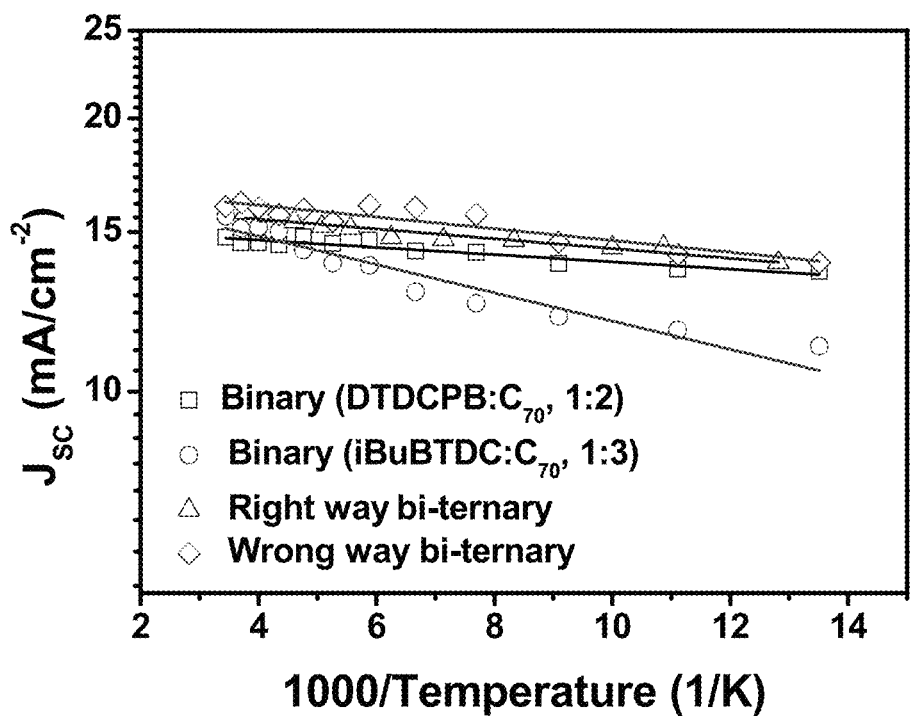
FIG. 10A is a temperature-dependent short circuit current density, $J_{SC}$. The points are the data, and the solid lines are fitted curves to an Arrhenius function.

These conclusions are supported by the dependence of $J_{SC}$ on temperature for the type 1 and 2 junctions shown in FIG. 10A. It was found that $J_{SC} \propto J_\infty \exp(-E_a/kT)$, where T is the temperature, k is Boltzmann's constant, $J_\infty$ is the value of $J_{SC}$ at T→∞, and $E_a$ is the activation energy for charge transport. For the DTDCPB:C₇₀ and iBuBTDC:C₇₀ binaries, and the type 1 and 2 junctions, we found $E_a$=0.81±0.05, 3.14±0.29, 1.09±0.10 and 1.30±0.11 meV, respectively, indicating the presence of only an insignificant energy barrier to charge conduction for all devices.

Figure 10B:
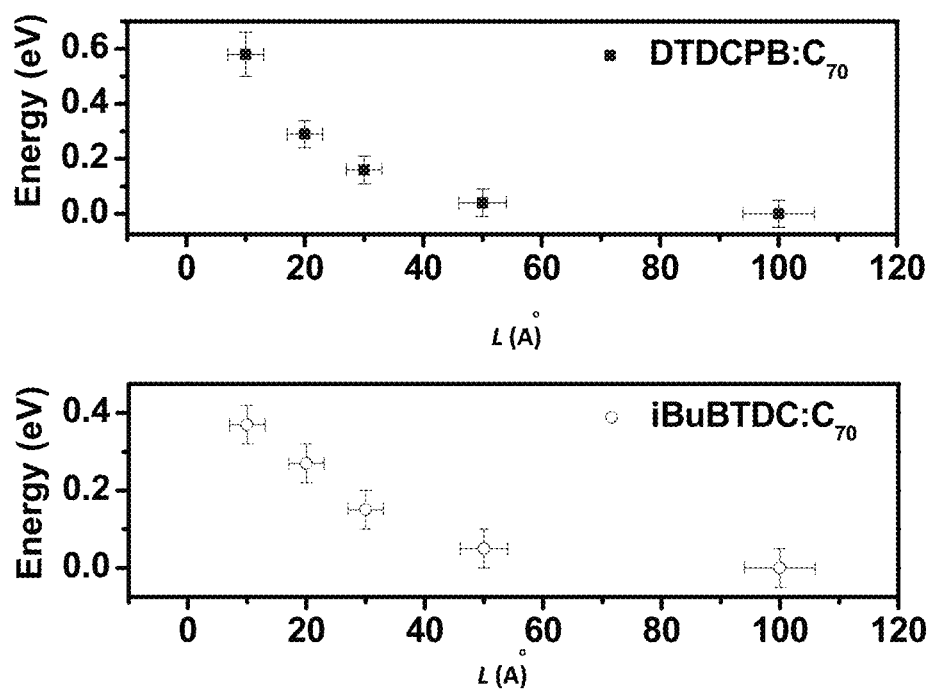
FIG. 10B is a graph of the highest occupied molecular orbital (HOMO) energy shift at the $MoO_3$ interface determined from UPS spectra. Here, L is the distance from the $MoO_3$ interface.

In FIG. 10B, UPS measurements show band bending over a distance of L=50 Å at the organic/MoO₃ interface, forming a surface barrier of approximately 0.5 eV that contributed to $V_{OC}$. The $E_{HOMO}$ of DTDCPB in the DTDCPB:C₇₀ (1:2) blend, and iBuBTDC in iBuBTDC:C₇₀ (1:3) near the MoO₃ interface shifted by ΔE=0.58±0.10 and 0.37±0.09 eV, respectively, compared with their bulk values. Since the dipole-induced energy level alignment resulted in the same $E_{HOMO}$ for DTDCPB:C₇₀ (1:2) and iBuBTDC:C₇₀ (1:3) blends, the barrier to hole transfer from the organics to the conduction band of MoO₃ were equal to ΔE. These losses at the interface therefore accounted for the differences in $V_{OC}$ for type 1 and 2 devices.

Figure 10C:
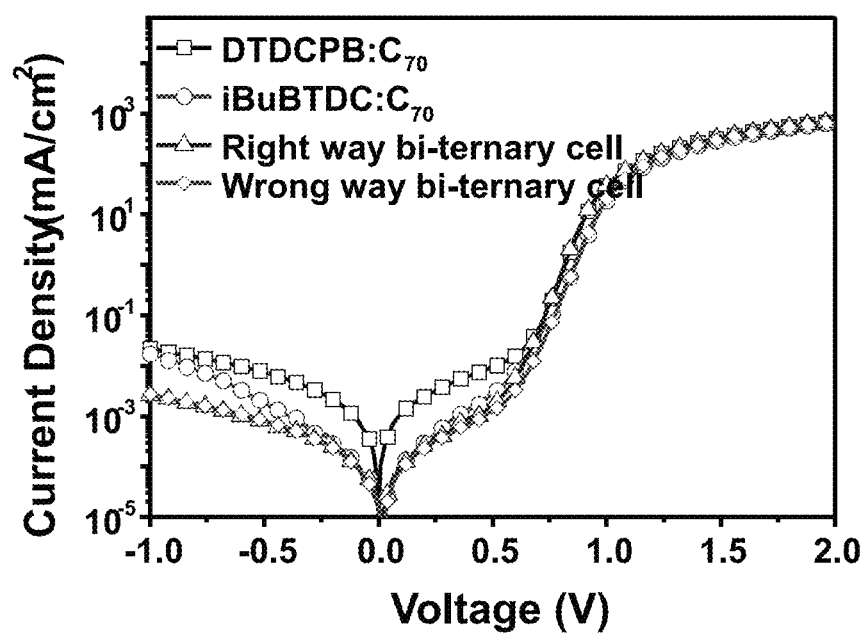
FIG. 10C is a graph of dark current-density-voltage characteristics of the bi-ternary cells together with the binary cells.

Another interesting finding was the increased FF of bi-ternaries compared to their constituent binaries. The FF is a function of the competing processes of recombination and extraction of charge carriers, with a low FF resulting from high recombination and/or series resistance. Now the fill factor is related to the slope of the forward-biased J-V characteristics, which in turn is quantified via the ideality factor, n. That is, $J \approx J_0 \exp(-qV/nkT)$, where $J_0$ is the saturation current. The value of n is indicative of the recombination mechanism, and is usually in the range between 1 and 2, with departures from unity commonly attributed to recombination via midgap states. Thus it is apparent that FF decreases with increasing n. The iBuBTDC:C₇₀ binary OPV showed the highest n=1.75±0.05 compared to the other three devices (n=1.60±0.05 for DTDCPB:C₇₀, 1.60±0.05 for the right way, and 1.64±0.05 for the wrong way cell), due to increased recombination, hence leading to the reduced FF of the iBuBTDC:C₇₀ device (FIG. 10C). While the source of this increased recombination may be due to morphological differences induced by the higher planarity of iBuBTDC. This led to improved coupling, and hence increased interface recombination, between donor and acceptor molecules, consistent with previous investigations on the dependence of FF on film properties.

Figure 11B:
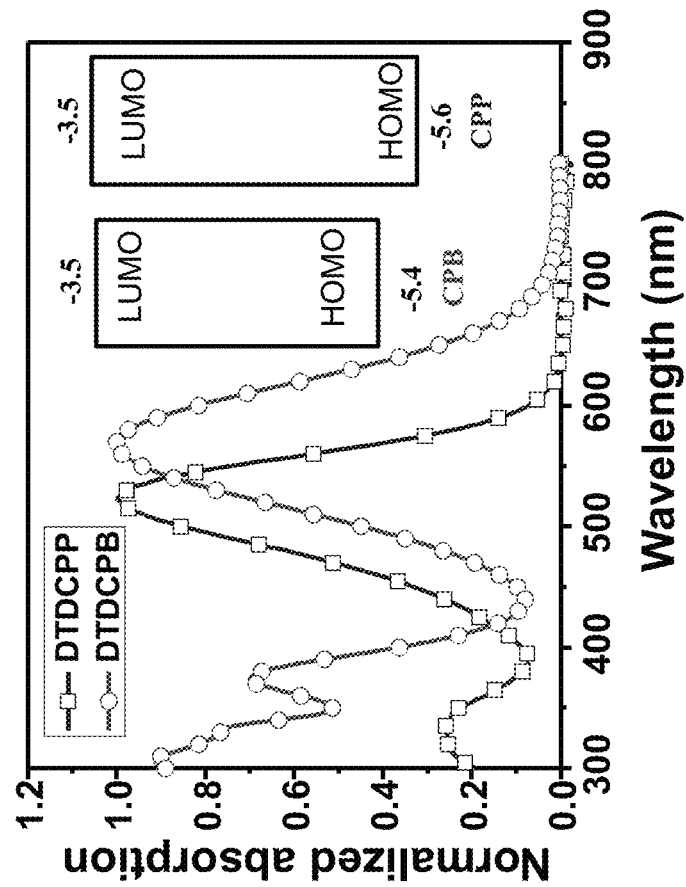
FIG. 11B shows the absorption spectra of DTDCPB and DTDCPP in dichloromethane solution.
Figure 11A:
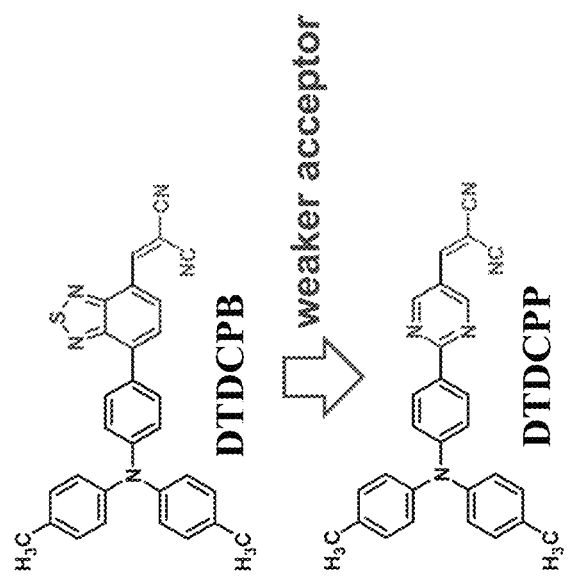
FIG. 11A shows the molecular structures of DTDCPB and DTDCPP.
Figures 12A, 12B:
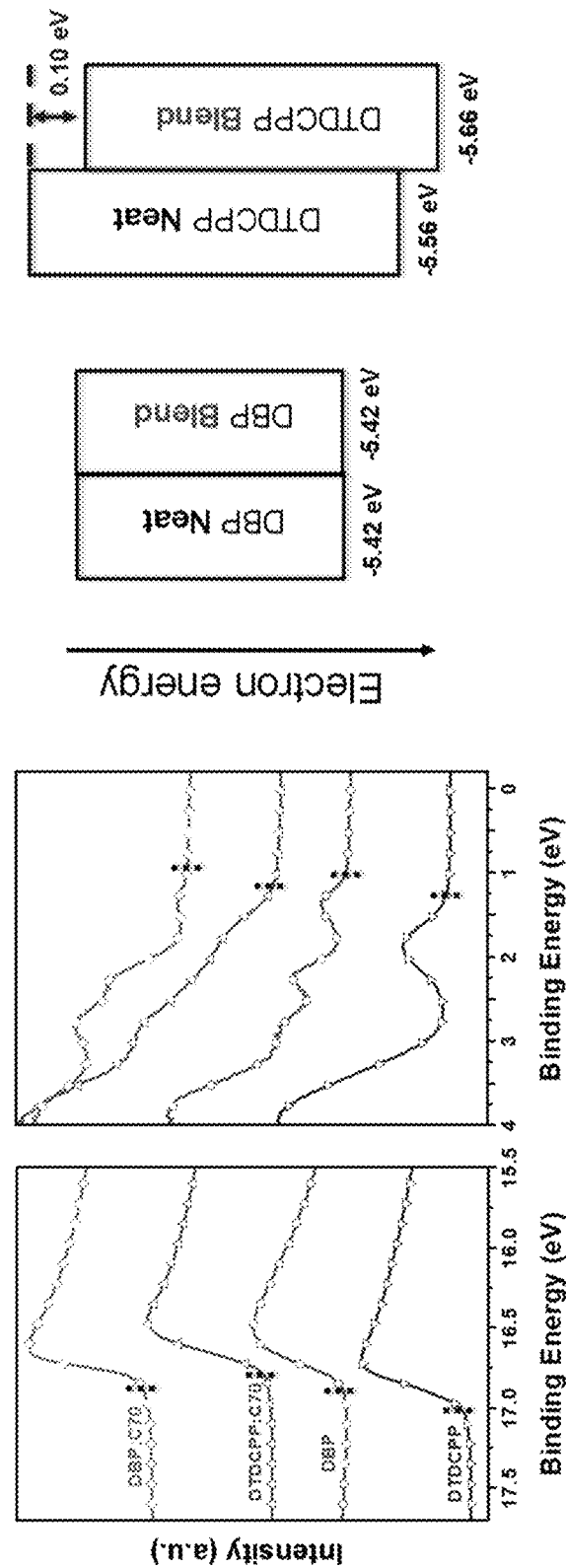
FIG. 12A shows ultraviolet photoelectron spectroscopy (UPS) spectra for DTDCPP, DBP neat film as well as mixed blends with $C_{70}$.
FIG. 12B is an Energy-level diagram extracted from UPS measurements on DTDCPP, DBP neat film and mixed blends with $C_{70}$.

To test the importance of the dipole-induced energy-level realignment between the two binary segments, bi-ternary devices were fabricated based on two different material systems. The first was based on the d-a-a' compound 2-{[2-(4-N,N-ditolylaminophenyl)-pyrimidin-5-yl]methylene}malononitrile (DTDCPP) (see FIG. 11A and FIG. 11B) and DTDCPB, both blended with $C_{70}$. FIG. 11A shows the molecular structures of DTDCPB and DTDCPP, while FIG. 11B shows the absorption spectra of DTDCPB and DTDCPP in dichloromethane solution. The inset of FIG. 11B shows an Energy diagram of DTDCPB and DTDCPP relative to vacuum obtained from UPS. FIG. 12A shows ultraviolet photoelectron spectroscopy (UPS) spectra for DTDCPP, DBP neat film as well as mixed blends with $C_{70}$. FIG. 12B shows the energy level diagrams of both DTDCPP ($\mu_g$=11.53 D) neat film and the blend with $C_{70}$. Similar to the other d-a-a' molecules, the DTDCPP HOMO energy shows a shift in the $C_{70}$ blend of $\Delta E_{HOMO}$=0.10±0.09 eV compared to the energy of the neat film. Bi-ternary devices based on two symmetric, largely non-polar molecules dibenzo{[f,f']-4,4',7,7'-tetraphenyl} diindeno[1,2,3-cd:1',2',3'-lm]perylene (DBP)[32] and boron subphthalocyanine chloride (SubPc) blended with $C_{70}$ were also fabricated. In contrast to the dipolar donor bi-ternaries, the $E_{HOMO}$ of DBP in the DBP:$C_{70}$ blend was the same as in the neat film. Here, the ground state dipole moment of SubPc was $\mu_g$=4.84 D, while for DBP $\mu_g$=0 D.

Figures 13A, 13B:
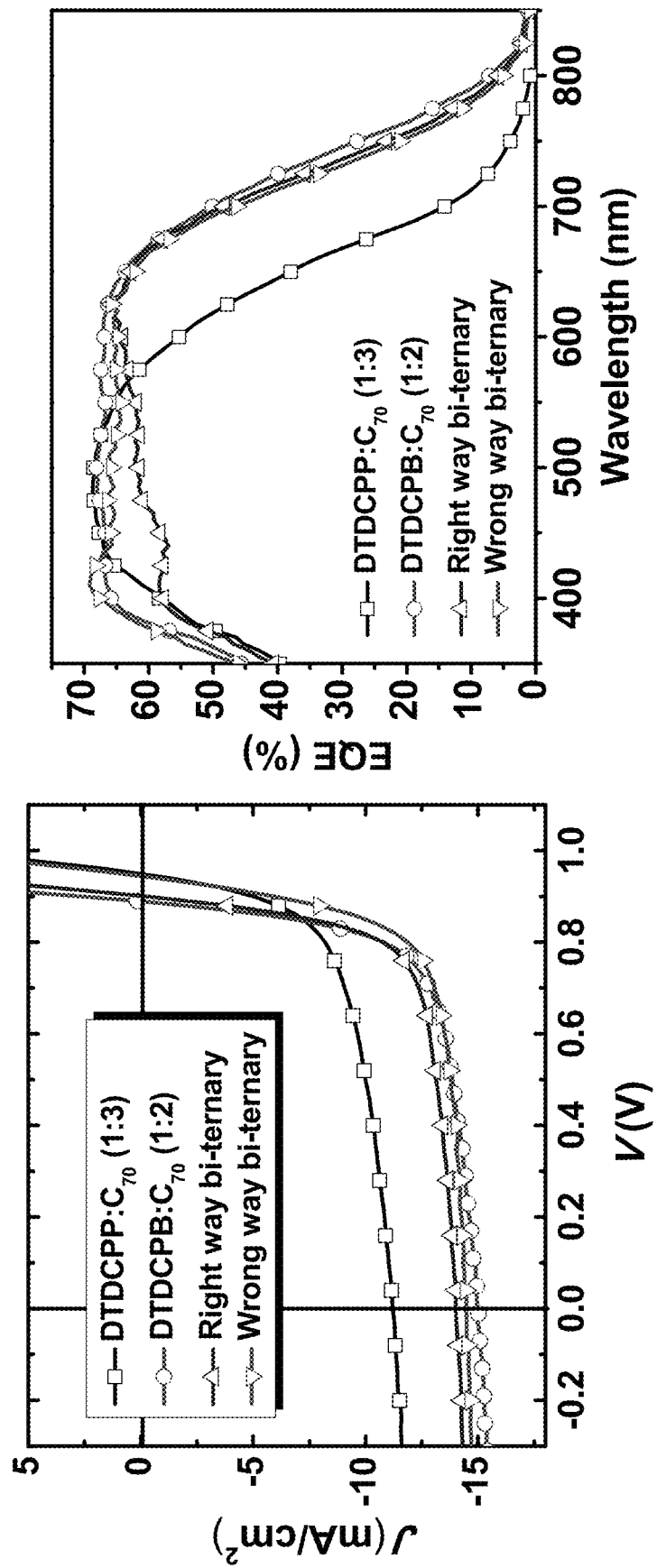
FIG. 13A is a graph of current-density-voltage characteristics.
FIG. 13B is a graph of external quantum efficiency (EQE) spectra of binary as well as bi-ternary cells based on DTDCPB:$C_{70}$ and DTDCPP:$C_{70}$.
Figure 13D:
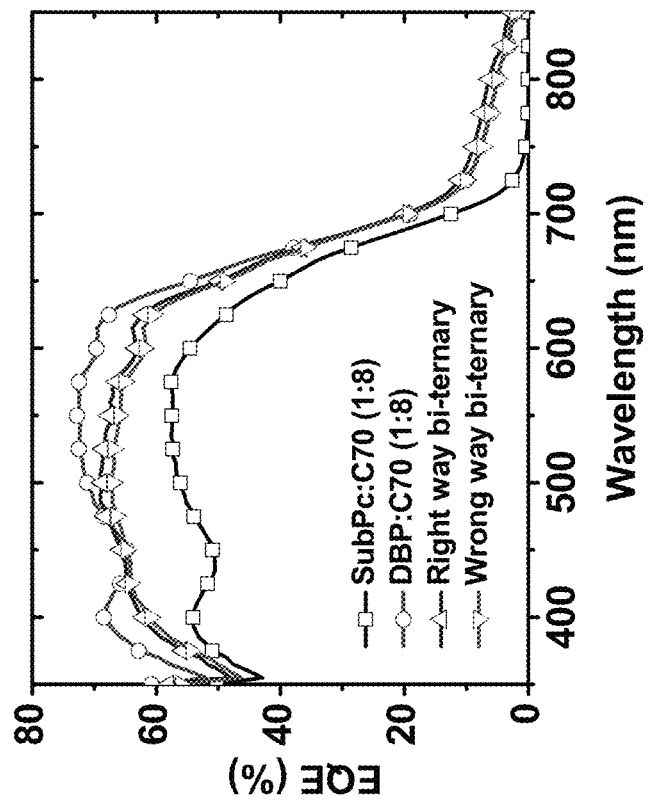
FIG. 13D is a graph of external quantum efficiency (EQE) spectra of binary as well as bi-ternary cells based on SubPc:$C_{70}$ and DBP:$C_{70}$.
Figure 13C:
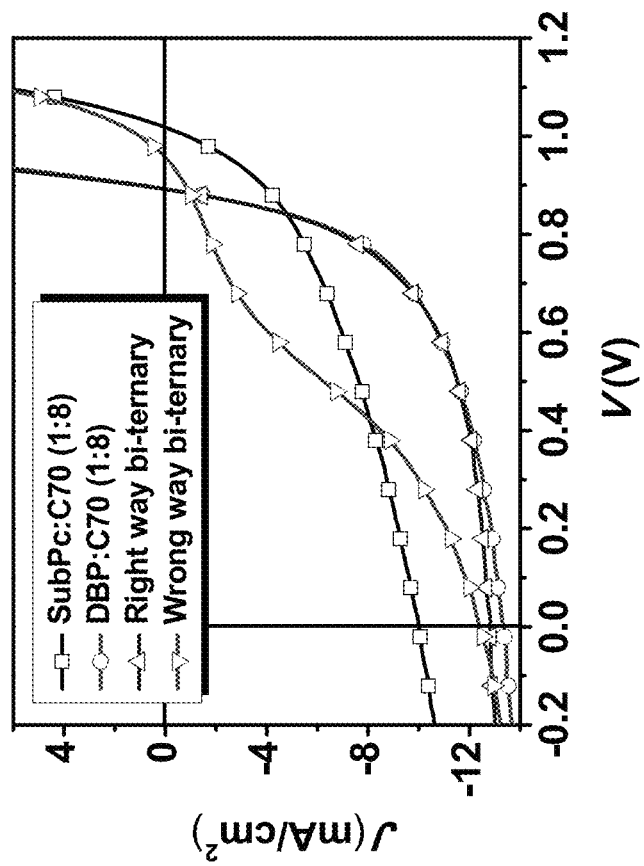
FIG. 13C is a graph of current-density-voltage characteristics.
Figure 14B:
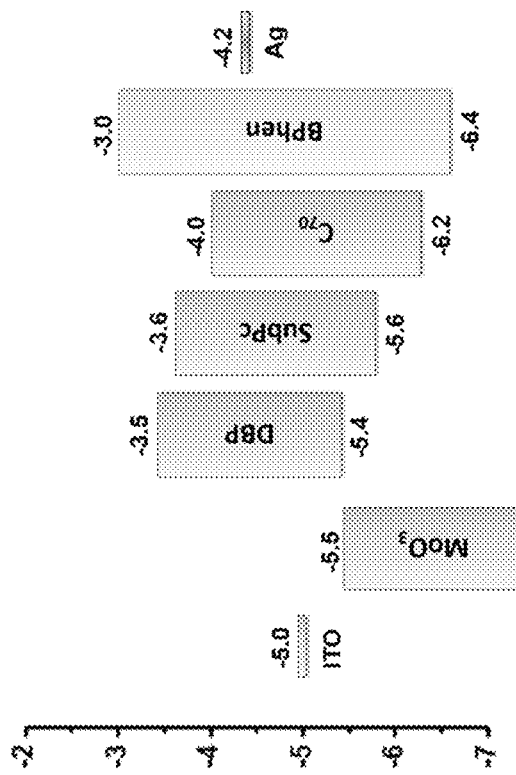
FIG. 14B is an energy level diagram of bi-ternary solar cell device based on DBP:$C_{70}$ and SubPc:$C_{70}$.
Figure 14A:
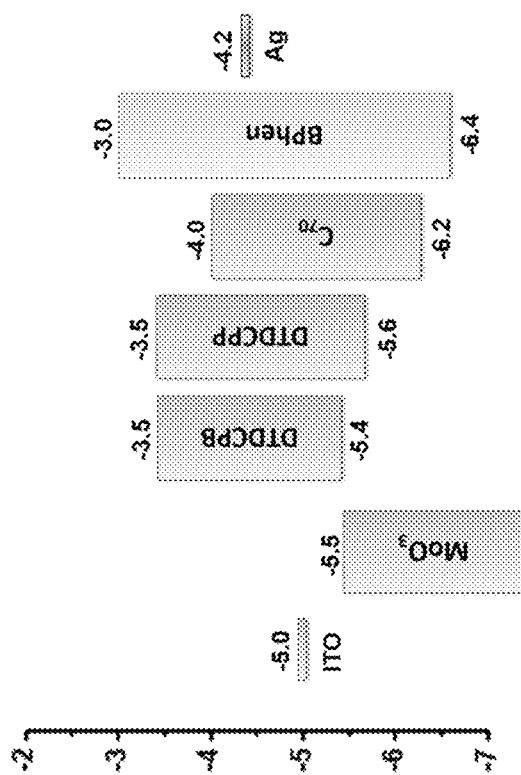
FIG. 14A is an energy level diagram of bi-ternary solar cell device based on DTDCPB:$C_{70}$ and DTDCPP:$C_{70}$.

The J-V characteristics of these two devices are plotted in FIG. 13A, FIG. 13B, FIG. 13C, and FIG. 13D. FIG. 13A and FIG. 13C show current-density-voltage characteristics, while FIG. 13B and FIG. 13D show external quantum efficiency spectra of binary as well as bi-ternary cells. A summary of the device performance is provided in Table 3 and Table 4 (below), respectively. As in the other two d-a-a'/fullerene devices, the wrong way DTDCPP and DTDCPB based bi-ternary OPV performance was superior to the constituent binaries. However, the DBP and SubPc based bi-ternary OPV had a reduced PCE. Further, an S-like shape in J vs. V was found in the DBP and SubPc based bi-ternary OPVs due to the 200 meV energy barrier at the interface between two HJs that impedes efficient charge transport (see FIG. 14A, FIG. 14B). This was in striking contrast to the highly dipolar bi-ternaries based on DTDCPB to DTDCPP that had no apparent barrier to hole transport. FIG. 14A shows an energy level diagram of a bi-ternary solar cell device based on DTDCPB:$C_{70}$ and DTDCPP:$C_{70}$. FIG. 14B shows an energy level diagram of a bi-ternary solar cell device based on DBP:$C_{70}$ and SubPc:$C_{70}$.

TABLE 3

| | $J_{sc}^{EQE}$ [mA/cm$^2$] | $V_{OC}$ [V] | FF [%] | PCE [%] |
|---|---|---|---|---|
| DTDCPB:$C_{70}$ (1:2) | 15.0 ± 0.4 | 0.90 ± 0.01 | 68.5 ± 1.2 | 9.2 ± 0.3 |
| DTDCPP:$C_{70}$ (1:3) | 11.3 ± 0.3 | 0.94 ± 0.01 | 62.1 ± 1.0 | 6.6 ± 0.2 |
| Bi-ternary (right way) | 14.0 ± 0.4 | 0.90 ± 0.01 | 70.7 ± 1.3 | 8.9 ± 0.2 |
| Bi-ternary (wrong way) | 14.5 ± 0.4 | 0.94 ± 0.01 | 70.4 ± 1.0 | 9.6 ± 0.3 |

TABLE 4

| | $J_{sc}^{EQE}$ [mA/cm$^2$] | $V_{OC}$ [V] | FF [%] | PCE$^a$ [%] |
|---|---|---|---|---|
| SubPc:$C_{70}$ (1:8) | 10.0 ± 0.3 | 1.00 ± 0.01 | 42.1 ± 1.0 | 4.2 ± 0.2 |
| DBP:$C_{70}$ (1:8) | 13.3 ± 0.4 | 0.90 ± 0.01 | 55.6 ± 0.8 | 6.6 ± 0.2 |
| Bi-ternary (right way) | 12.8 ± 0.3 | 0.90 ± 0.01 | 57.2 ± 1.0 | 6.6 ± 0.2 |
| Bi-ternary (wrong way) | 12.4 ± 0.4 | 0.96 ± 0.01 | 28.6 ± 1.0 | 3.4 ± 0.1 |

With reference to Table 3, the average PCE value was based on measurement of 8 devices. The bi-ternary right way device had the following structure: indium tin oxide (ITO)/MoO$_3$ (10 nm)/DTDCPB:$C_{70}$ (1:2, 60 nm)/DTDCPP:$C_{70}$ (1:3, 20 nm)/bathophenanthroline (BPhen, 7 nm)/Ag (100 nm). The bi-ternary wrong way device had the following structure: indium tin oxide (ITO)/MoO$_3$ (10 nm)/DTDCPP:$C_{70}$ (1:3, 20 nm)/DTDCPB:$C_{70}$ (1:2, 60 nm)/bathophenanthroline (BPhen, 7 nm)/Ag (100 nm).

With reference to Table 4, the average PCE value was based on measurement of four devices. The bi-ternary (right way) device had the following structure: indium tin oxide (ITO)/MoO$_3$ (10 nm)/DBP:$C_{70}$ (1:8, 60 nm)/SubPc:$C_{70}$ (1:8, 20 nm)/bathophenanthroline (BPhen, 7 nm)/Ag (100 nm). The bi-ternary (wrong way) device had the following structure: indium tin oxide (ITO)/MoO$_3$ (10 nm)/SubPc:$C_{70}$ (1:8, 20 nm)/DBP:$C_{70}$ (1:8, 60 nm)/bathophenanthroline (BPhen, 7 nm)/Ag (100 nm).

Recently, Ghasemi, et. al reported a fused pair of bulk HJs fabricated using orthogonal solvents and a stamp transfer process. (Ghasemi, et al., Panchromatic Sequentially Cast Ternary Polymer Solar Cells. *Adv. Mater.* 2017, 29, 1604603.) In that case, the region between two HJs undergoes intermixing, which was explained by poor solvent resistance of the underlying HJ. This resulted in a reduced the FF and $V_{OC}$ compared to the constituent binaries. In contrast, no component intermixing was found in the vacuum-processed small molecule bi-ternaries, which was essential for minimizing charge recombination by avoiding the development of an unfavorable morphology and energy misalignment of three-component active regions.

Materials

Figure 15:
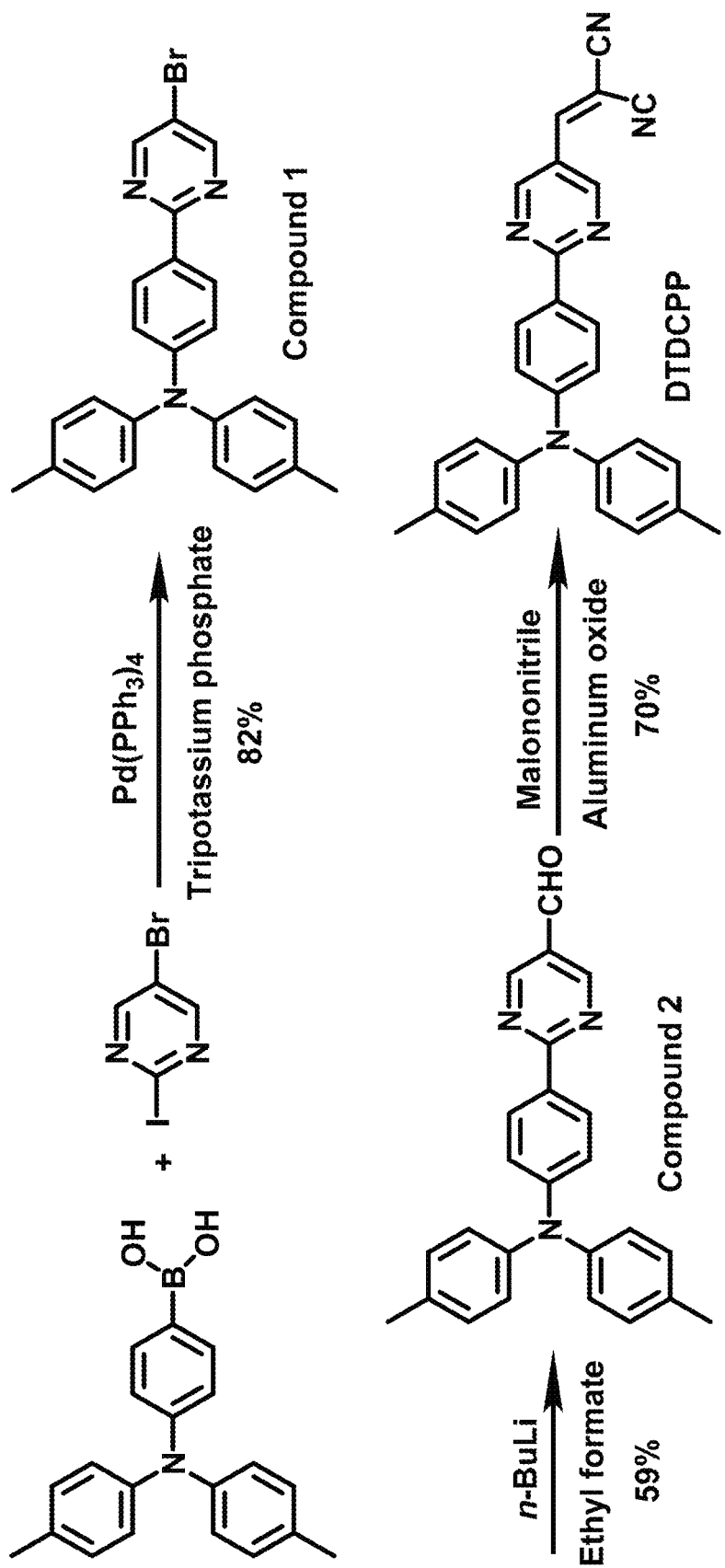
FIG. 15 is a diagram of synthetic routes for DTDCPP.

All devices were grown on patterned ITO (sheet resistance of 15 Ω/sq) on glass substrates. The iBuBTDC and DTDCPP were synthesized following procedures outlined below and shown in FIG. 15. The DTDCPB, iBuBTDC, DTDCPP and $C_{70}$ were purified once by temperature-gradient sublimation prior to deposition. The internal dipole moments of the ground states were calculated using density functional theory using the B3LYP hybrid functional with the 6-31G** basis set.

A mixture of (4-(di-p-tolylamino)phenyl)boronic acid (2.22 g, 7.0 mmol), 5-bromo-2-iodopyrimidine (1.99 g, 7.0 mmol), Pd(PPh$_3$)$_4$ (404 mg, 0.35 mmol), tripotassium phosphate (4.46 g, 21 mmol), and few drops of Aliquat 336 in anhydrous tetrahydrofuran (32 mL) and nitrogen-bubbled water (10 mL) was stirred and heated at reflux temperature under argon atmosphere for 16 h. After cooling to room temperature, the solvent was removed by rotary evaporation. The resulting mixture was extracted with dichloromethane, washed with brine, dried over anhydrous MgSO$_4$, filtered, and then concentrated under reduced pressure. The crude product was purified by column chromatography with CH$_2$Cl$_2$:hexanes=1:2 (v/v) as eluent to yield compound 1

Figure 16A:
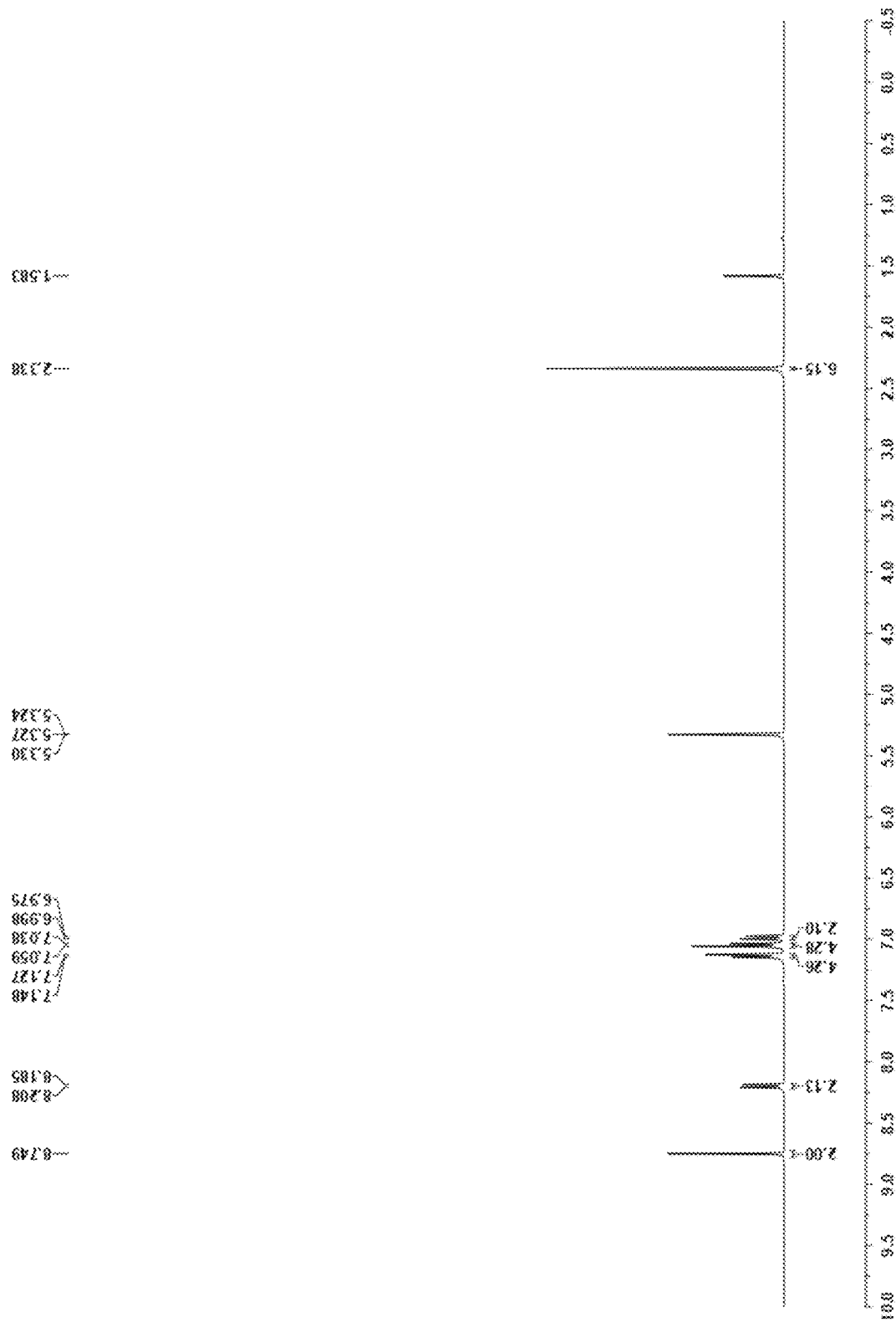
FIG. 16A is a diagram of $^1$H NMR spectra.
Figure 16B:
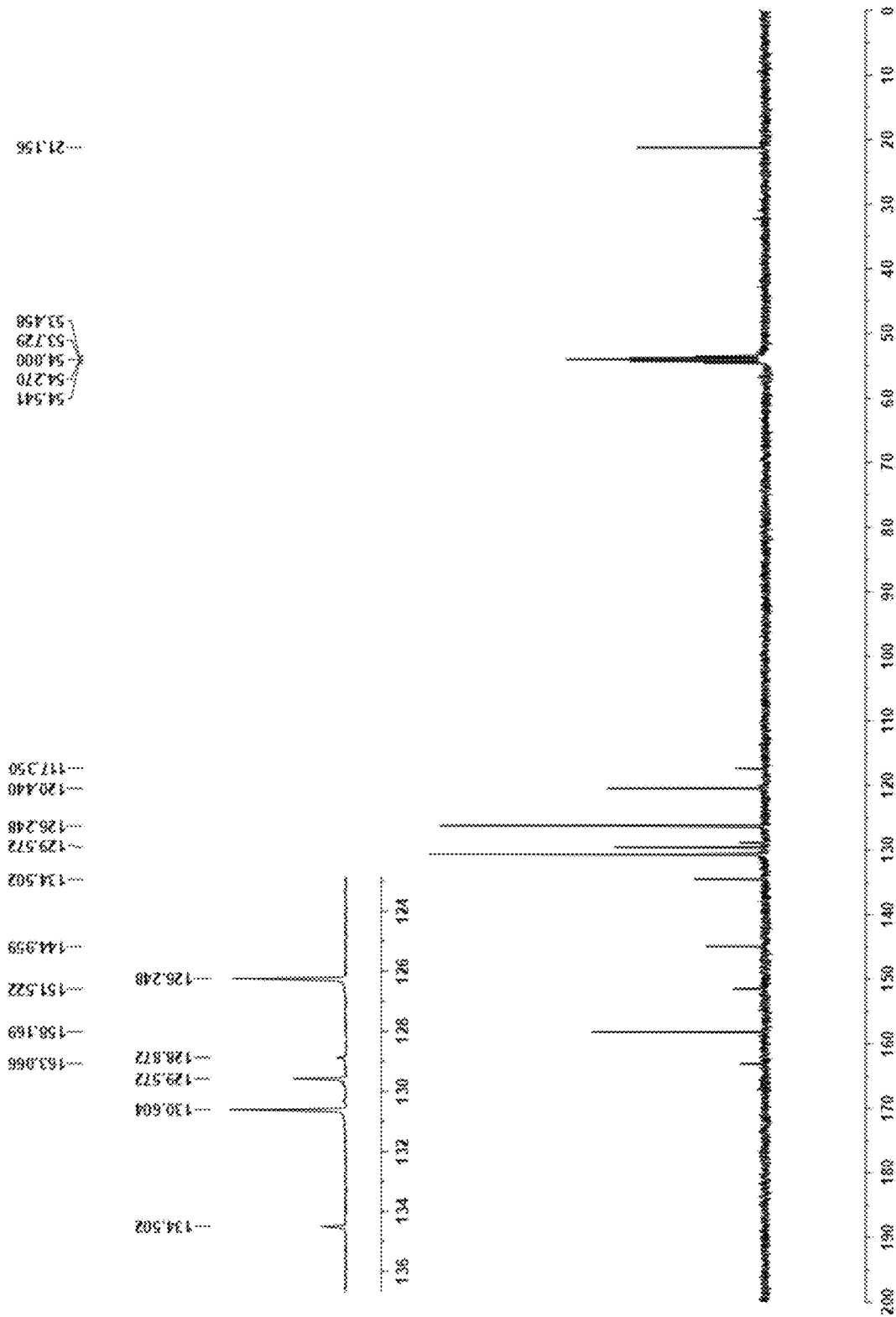
FIG. 16B is a diagram of $^{13}$C NMR spectra.

(see FIG. 15) as a pale yellow solid (2.48 g, 82%). $^1$H NMR (400 MHz, $CD_2Cl_2$) δ 8.75 (s, 2H), 8.20 (d, J=9.0 Hz, 2H), 7.14 (d, J=8.5 Hz, 4H), 7.05 (d, J=8.3 Hz, 4H), 6.99 (d, J=9.0 Hz, 2H), 2.34 (s, 6H); $^{13}$C NMR (100 MHz, $CD_2Cl_2$) δ 163.07, 158.17, 151.52, 144.96, 134.50, 130.60, 129.57, 128.87, 126.25, 120.44, 117.35, 21.16. HRMS (m/z, MALDI, M$^+$) calcd for $C_{24}H_{20}{}^{79}BrN_3$: 429.0841, found 429.0855; calcd for $C_{24}H_{20}{}^{81}BrN_3$: 431.0820, found 431.0958. (see FIGS. 16A and 16B)

Figure 16C:
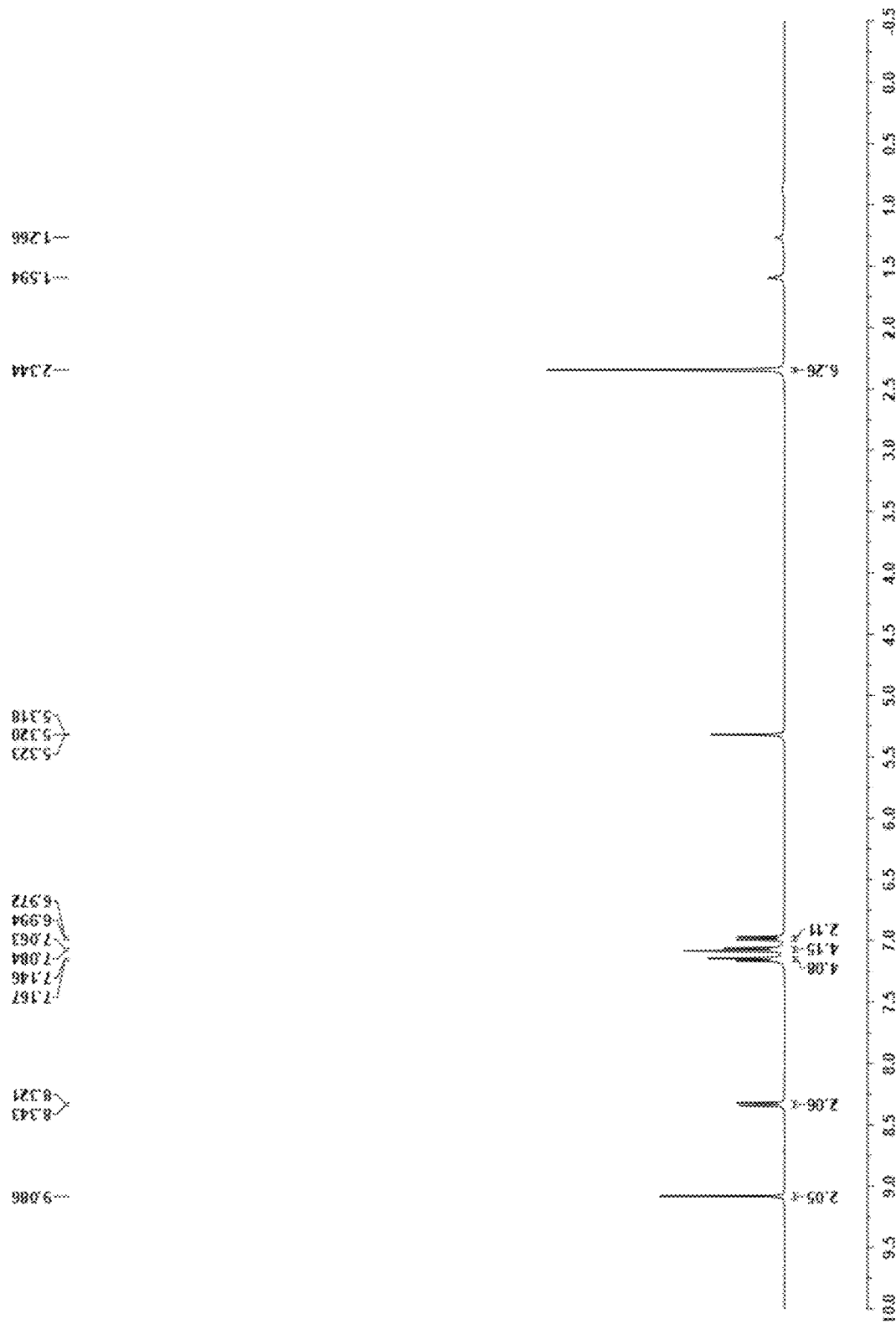
FIG. 16C is a diagram of $^1$H NMR spectra.
Figure 16D:
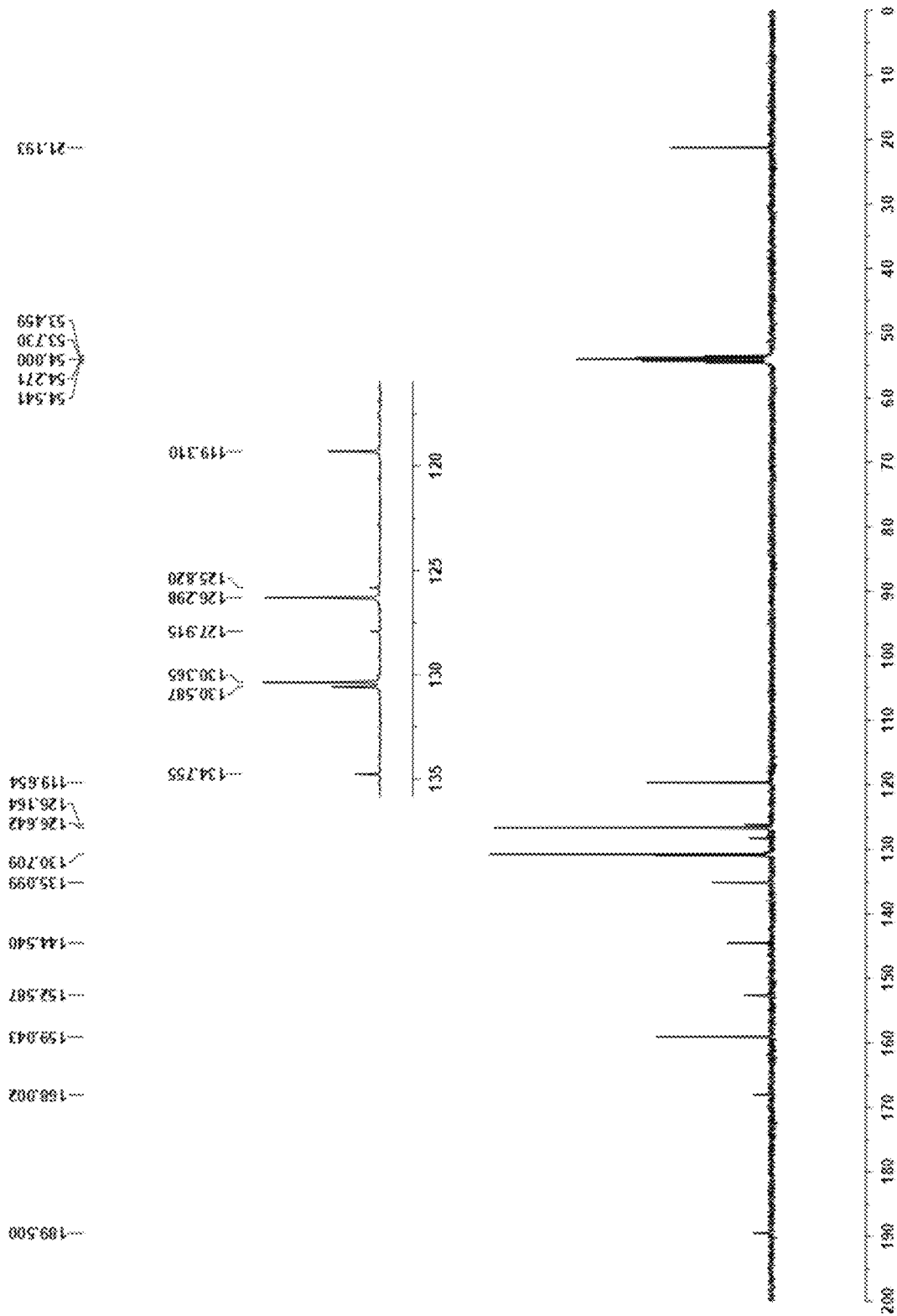
FIG. 16D is a diagram of $^{13}$C NMR spectra.

A solution of Compound 1 (1.29 g, 3.0 mmol) in anhydrous THF (50 mL) under argon atmosphere was added dropwise n-butyllithium (1.6 M in hexane, 2.0 mL, 3.2 mmol) at −100° C. After stirring for 30 mins, ethyl formate (2.4 mL, 30 mmol) was added in one portion, the resulting mixture stirred under the same temperature for 30 mins, and then quenched with 10% $HCl_{(aq)}$. The reaction mixture was warmed to room temperature, extracted with dichloromethane, washed with $H_2O$ and brine, dried over anhydrous $MgSO_4$, and concentrated under reduced pressure. The crude product was purified by column chromatography with $CH_2Cl_2$:hexanes=2:1 (v/v) as eluent to yield Compound 2 as a yellow solid (0.67 g, 59%). $^1$H NMR (400 MHz, $CD_2Cl_2$) δ 10.05 (s, 1H), 9.09 (s, 2H), 8.33 (d, J=9.1 Hz, 2H), 7.16 (d, J=8.2 Hz, 4H), 7.07 (d, J=8.4 Hz, 4H), 6.98 (d, J=9.0 Hz, 2H), 2.34 (s, 6H); $^{13}$C NMR (100 MHz, $CD_2Cl_2$) δ 189.50, 168.00, 159.04, 152.59, 144.54, 135.10, 130.93, 130.71, 128.26, 126.64, 126.16, 119.65, 21.19. HRMS (m/z, ESI, M$^+$) calcd for $C_{25}H_{21}N_3O$: 379.1685, found 379.1679. (see FIGS. 16C and 16D).

Figure 16E:
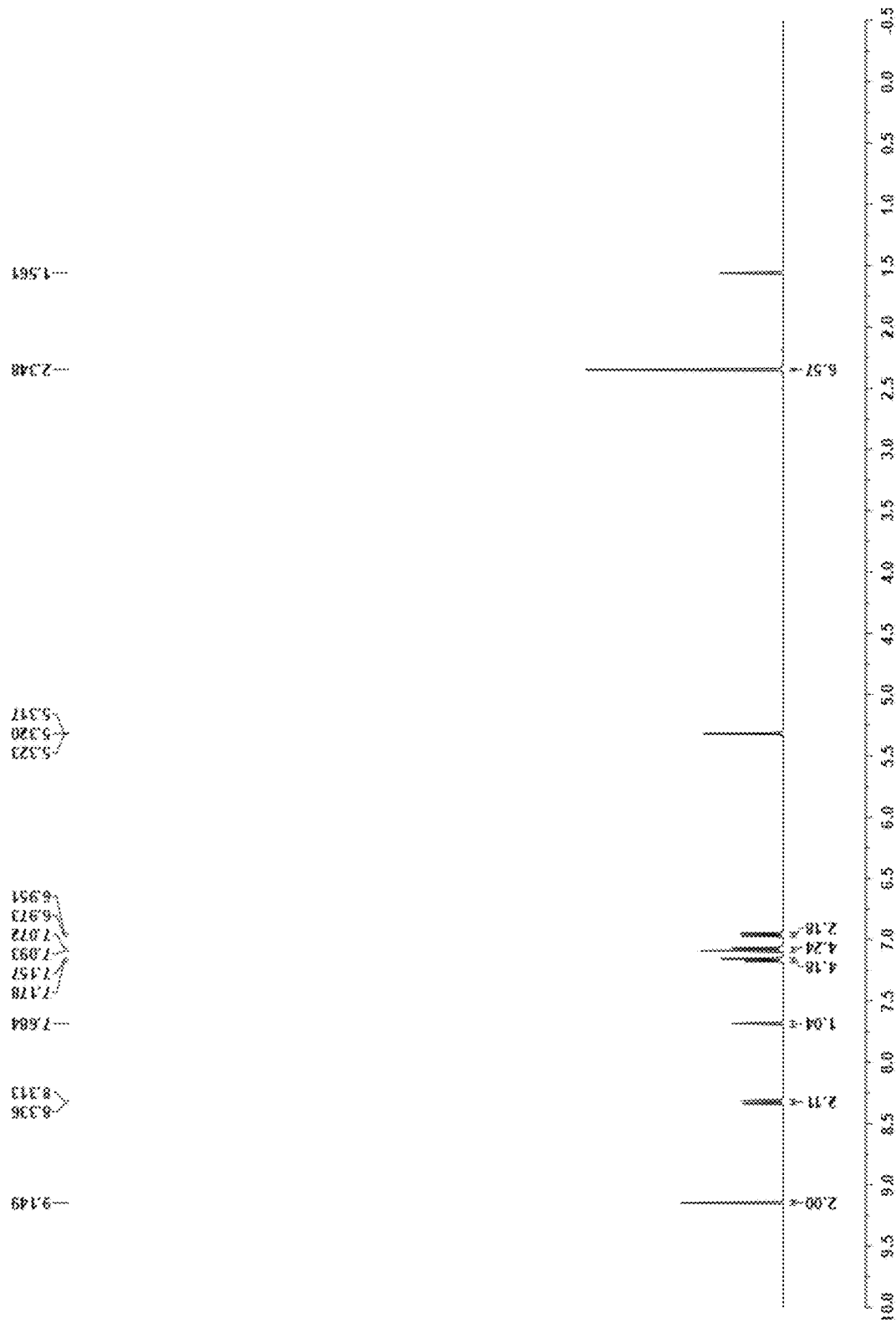
FIG. 16E is a diagram of $^1$H NMR spectra.
Figure 16F:
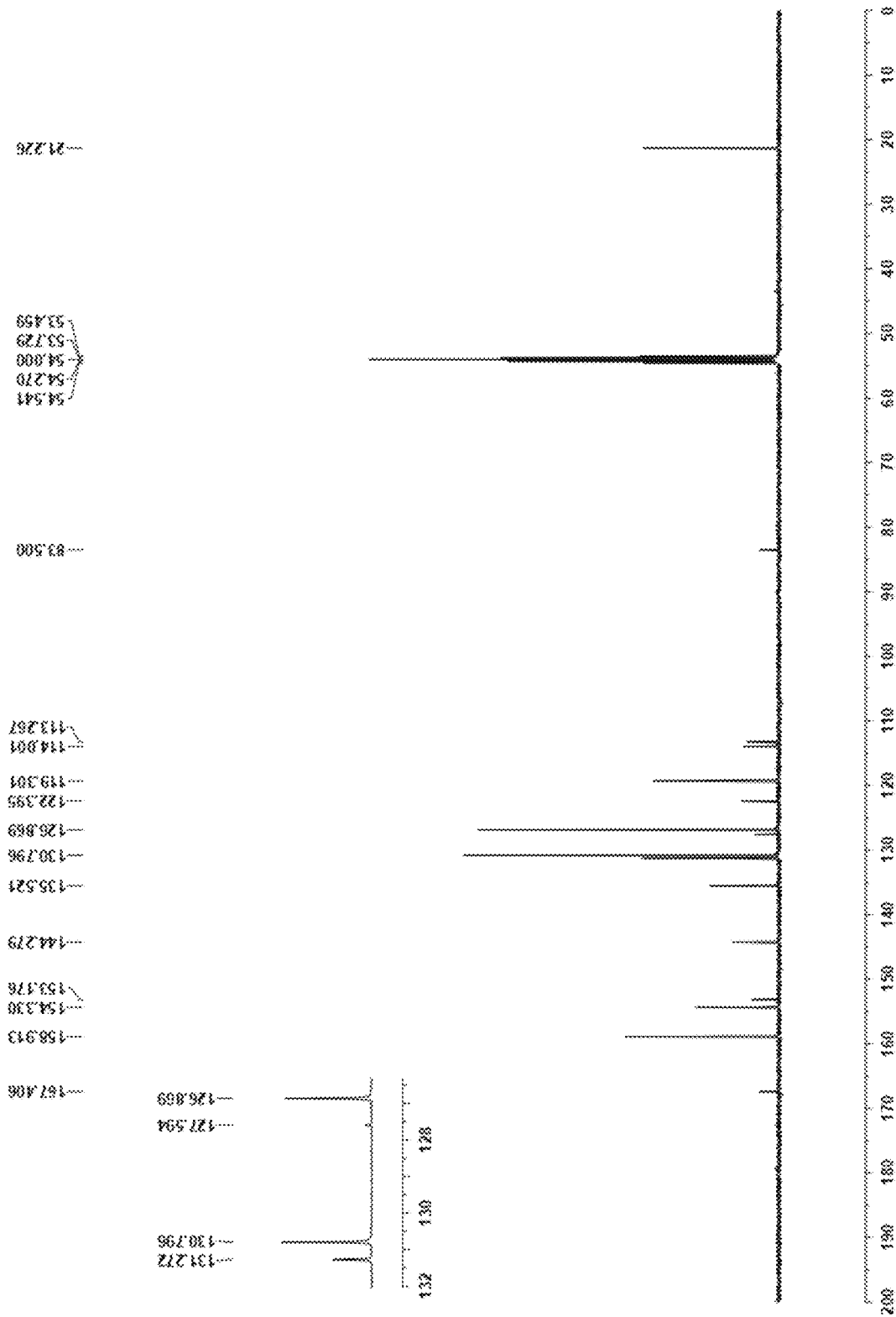
FIG. 16F is a diagram of $^{13}$C NMR spectra.

A mixture of Compound 2 (1.07 g, 2.8 mmol), malononitrile (0.37 g, 5.6 mmol) and basic aluminum oxide were dissolved in anhydrous toluene (43 mL) and then stirred at 70° C. for 20 min. The resulting mixture was filtered, washed with dichloromethane, and concentrated under reduced pressure. The collecting solid was purified by column chromatography with $CH_2Cl_2$ as eluent to yield 2-{[2-(4-N,N-ditolylaminophenyl)-pyrimidin-5-yl]methylene}malononitrile (DTDCPP) as a red solid (0.85 g, 70%). $^1$H NMR (400 MHz, $CD_2Cl_2$) δ 9.15 (s, 2H), 8.32 (d, J=9.0 Hz, 2H), 7.68 (s, 1H), 7.17 (d, J=8.4 Hz, 4H), 7.08 (d, J=8.4 Hz, 4H), 6.96 (d, J=9.0 Hz, 2H), 2.35 (s, 6H); $^{13}$C NMR (100 MHz, $CD_2Cl_2$) δ 167.41, 158.91, 154.33, 153.18, 144.28, 135.52, 131.27, 130.80, 127.59, 126.87, 122.39, 119.30, 114.00, 113.27, 83.50, 21.23. HRMS (m/z, MALDI, M$^+$) calcd for $C_{28}H_{21}N_5$: 427.1797, found 427.1767. (See FIGS. 16E and 16F).

Solar Cell Fabrication

The substrates were cleaned using a detergent (tergitol solution) and solvents followed by $CO_2$ snow cleaning and exposed to ultraviolet-ozone for 15 min before growth of the individual binary cells. The vacuum deposited $MoO_3$ was grown at ~ 1 Å/s in a high vacuum chamber with a base pressure of $2×10^{-7}$ torr. The active layer (80 nm thick) was grown by co-deposition of the donor and acceptor molecules. The deposition rate of each material was monitored by individual crystal sensors to achieve the desired volume ratios. For the bi-ternary, the growth of the second HJ immediately followed that of the first without breaking vacuum. The Bphen and Ag films were subsequently deposited at 0.6 nm/s. The areas of the OPVs were defined by the patterned ITO anode, and the Ag cathode deposited through a 50 μm thick shadow mask, resulting in a device area of 4.0 mm$^2$.

Solar Cell Characterization

The J-V characteristics and spectrally resolved EQE were measured in a glove box filled with ultrapure $N_2$ (<0.1 ppm). Light from a Xe lamp filtered to achieve a simulated AM 1.5G spectrum (ASTM G173-03) was used as the source for the J-V measurements. The lamp intensity controlled by neutral density filters was calibrated using a standard Si reference cell (with a KG-2 filter) traceable to certification by the National Renewable Energy Laboratory (NREL). Each cell was measured under six different light intensities from 0.001 sun to 1 sun (100 mW/cm$^2$). Errors quoted accounted for variations from three or more cells measured, as well as an additional systematic error of 5% for $J_{SC}$ and PCE. The device was measured using a 3.14 mm$^2$ metal mask. The EQE measurements were performed with devices underfilled by a 200 Hz-chopped monochromated and focused beam from a Xe lamp. The current outputs from the devices as well as from a reference NIST-traceable Si detector were recorded using a lock-in amplifier. The integrated $J_{sc}$ is within 5% of the solar simulation measurement.

Time-of-Flight Secondary Ion Mass Spectrometry

The experiments used a liquid metal ion gun (LMIG) primary ion source. The instrument (IONTOF TOF-SIMS 5) was operated in an ion microprobe mode in which the bunched, pulsed primary ion beam was rastered across the sample's surface. A continuous Bi$^{3+}$ beam of 3 keV energy was employed to sputter the surface, and data were extracted from a 150×150 μm$^2$ acquisition area. The sputtering rate was determined from the single layer samples.

Temperature-Dependent J-V Measurements

The OPVs were loaded into an open-cycle liquid $N_2$ cryostat where the J-V characteristics were obtained in the dark and under illumination using a semiconductor parameter analyzer. The light intensity was calibrated using a NREL-traceable Si reference cell. During measurement, the cryostat was maintained at 1 mTorr to prevent degradation by exposure to oxygen or moisture. The samples were cooled to 77 K and allowed to equilibrate for 1 h. The measurements were taken at 20 K intervals using a thermally controlled stage heater with the sample temperature allowed to stabilize for 20-min between measurements. To minimize trap-induced hysteresis in the J-V characteristics apparent at low temperatures, the devices were maintained at 0 V for 5 s before voltage sweeps in both the reverse and forward directions. The J-V characteristics under white light illumination were taken at a 100 mW/cm$^2$.

Ultraviolet Photoelectron Spectroscopy

The HOMO energies were measured using ultraviolet photoelectron spectra taken in high vacuum (10$^{-8}$ torr) with a 21.2 eV photon source. Organic thin films were grown on conductive ITO substrates as described above. The energy barrier between the organics to the conduction band of $MoO_3$ was estimated by measuring the HOMO of the donor:$C_{70}$ blend near the $MoO_3$ interface with a 1, 2, 3 and 5-nm-thick respectively, measuring the HOMO of the donor:$C_{70}$ blend in the bulk and taking the difference between these energies.

Cyclic Voltammetry Measurements

The measurement of oxidation potentials were carried out in anhydrous $CH_2Cl_2$ solution (1.0 mM) containing 0.1 M tetrabutylammonium hexafluorophosphate (TBAPF$_6$) as a supporting electrolyte, while the measurement of the reduction potentials were conducted in an anhydrous THF solution (1.0 mM) containing 0.1 M tetrabutylammonium perchlorate (TBAP) as a supporting electrolyte, purged with argon prior to conduct the measurements. A glassy carbon electrode and a platinum wire were used as the working electrode and counter electrode, respectively. All potentials were recorded versus Ag/AgCl (saturated) as a reference electrode and calibrated with the ferrocene/ferrocenium (Fc/Fc+) redox couple. All measurements were performed at a scan rate of 100 mVs$^{-1}$.

Single Crystal Structure Determinations

Crystallographic data were collected at 295(2) K on an Oxford Gemini A CCD diffractometer using graphite-monochromatized Cu-Kα radiation (λ=1.54178 Å). Cell parameters were retrieved and refined using CrysAlis Pro software on all observed reflections. Data reduction was performed with the CrysAlis Pro software. The structures were solved and refined with SHELXL programs. The hydrogen atoms were included in calculated positions and refined using a riding mode.

Disclosed herein in one embodiment is a high efficiency, vacuum thermally evaporated small molecule OPV with PCE=10.6±0.3% produced by fusing two, individual binary d-a-a' donor and $C_{70}$ acceptor mixed HJs at a planar junction. The $V_{OC}$ of the bi-ternary OPV corresponded to that of the binary sub-element contacting the anode. Dipole interactions between the d-a-a' donor and $C_{70}$ acceptor destabilized the HOMO energy of donor in the blends by 0.1-0.3 eV, eliminating the energy barrier to hole transport that otherwise would exist in bi-ternary OPVs where the HOMO of that contacting the anode was deeper than the more distant sub-element.

The disclosures of each and every patent, patent application, and publication cited herein are hereby incorporated herein by reference in their entirety. While this disclosure has been presented with reference to specific embodiments, it is apparent that other embodiments and variations of this disclosure may be devised by others skilled in the art without departing from the true spirit and scope of the disclosure. The appended claims are intended to be construed to include all such embodiments and equivalent variations.

What is claimed is:

1. A photovoltaic cell comprising:
    an anode;
    a cathode;
    a first binary bulk heterojunction positioned between the anode and the cathode, comprising a first donor material and a first acceptor material; and
    a second binary bulk heterojunction positioned between the first binary bulk heterojunction and the cathode, in direct contact with the first binary bulk heterojunction, comprising a second donor material and the first acceptor material;
    wherein the second donor material has a Highest Occupied Molecular Orbital (HOMO) energy level closer to a vacuum level than a HOMO energy level of the first donor material, and wherein the second donor material has a Lowest Unoccupied Molecular Orbital (LUMO) energy level closer to the vacuum level than a LUMO energy level of the first donor material; and
    wherein the first donor material and the second donor material are dipolar.

2. The photovoltaic cell of claim 1, wherein the first acceptor material comprises a fullerene acceptor material.

3. The photovoltaic cell of claim 2, wherein the first acceptor material comprises $C_{70}$ fullerene.

4. The photovoltaic cell of claim 1, wherein the first acceptor material comprises a non-fullerene acceptor material.

5. The photovoltaic cell of claim 1, further comprising a third binary bulk heterojunction positioned between the second binary bulk heterojunction and the cathode, comprising a third donor material and a third acceptor material.

6. The photovoltaic cell of claim 1, wherein the first donor material comprises iBuBTDC.

7. The photovoltaic cell of claim 6, wherein the second donor material comprises DTDCPB.

8. The photovoltaic cell of claim 1, wherein the first donor material comprises DTDCPB.

9. The photovoltaic cell of claim 1, wherein the first donor material and the second donor material absorb at one or more overlapping wavelengths.

10. A photovoltaic cell produced by a method comprising the steps of:
    providing a substrate in a vacuum;
    depositing an anode over the substrate;
    depositing a first heterojunction layer over the anode layer;
    depositing a second heterojunction layer directly on the first heterojunction layer;
    depositing a cathode over the second heterojunction layer; and
    releasing the vacuum;
    the photovoltaic cell comprising:
    the anode;
    the cathode;
    the first heterojunction positioned between the anode and the cathode, comprising a first donor material and a first acceptor material; and
    the second heterojunction positioned between the first binary bulk heterojunction and the cathode, comprising a second donor material and the first acceptor material;
    wherein the second donor material has a Highest Occupied Molecular Orbital (HOMO) energy level closer to a vacuum level than a HOMO energy level of the first donor material, and wherein the second donor material has a Lowest Unoccupied Molecular Orbital (LUMO) energy level closer to the vacuum level than a LUMO energy level of the first donor material; and
    wherein the first donor material and the second donor material are dipolar.

11. The photovoltaic cell of claim 10, wherein the photovoltaic cell has a power conversion efficiency of at least 10%.

* * * * *